United States Patent
Choi

(10) Patent No.: US 8,597,464 B2
(45) Date of Patent: Dec. 3, 2013

(54) INDUCTIVELY COUPLED PLASMA REACTOR WITH MULTIPLE MAGNETIC CORES

(75) Inventor: Dae-Kyu Choi, Suwon-si (KR)

(73) Assignee: New Power Plasma Co., Ltd, Gyeonggi-do (KR)

( * ) Notice: Subject to any disclaimer, the term of this patent is extended or adjusted under 35 U.S.C. 154(b) by 1293 days.

(21) Appl. No.: 11/737,648

(22) Filed: Apr. 19, 2007

(65) Prior Publication Data

US 2007/0245963 A1 Oct. 25, 2007

(51) Int. Cl.
*C23C 16/00* (2006.01)
*H01L 21/306* (2006.01)

(52) U.S. Cl.
USPC .............. 156/345.49; 118/723 I; 118/723 IR; 118/723 AN

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 3,406,241 A | * | 10/1968 | Robinson | 373/107 |
| 5,922,134 A | * | 7/1999 | Ohbuchi | 118/723 ER |
| 5,998,933 A | * | 12/1999 | Shun'ko | 315/111.51 |
| 6,027,606 A | * | 2/2000 | Mohn et al. | 156/345.34 |
| 6,203,657 B1 | * | 3/2001 | Collison et al. | 156/345.48 |
| 6,348,126 B1 | * | 2/2002 | Hanawa et al. | 156/345.49 |
| 2003/0085205 A1 | * | 5/2003 | Lai et al. | 219/121.43 |
| 2006/0289409 A1 | * | 12/2006 | Choi et al. | 219/121.57 |

* cited by examiner

Primary Examiner — Luz Alejandro Mulero
(74) Attorney, Agent, or Firm — IP & T Group LLP

(57) ABSTRACT

There is provided an inductively coupled plasma reactor. The inductively coupled plasma reactor is connected to a transformer with multiple magnetic cores and a primary winding, to transfer an electromotive force for plasma discharge to a plasma discharge chamber of a reactor body. Parts of magnetic core positioned in side the plasma discharge chamber are protected by being entirely covered by a core protecting tube. The primary winding is electrically connected to a power supply source providing radio frequency power. In the inductively coupled plasma reactor, since a number of magnetic core cross sectional parts are positioned inside the plasma discharge chamber, the efficiency of transferring the inductively coupled energy to be connected with plasma is very high.

17 Claims, 28 Drawing Sheets tap_1 = 1 turn
tap_2 = 2 trun
tap_3 = 3 trun

MULTIPLE GAS OUTPUT

INDUCTIVELY COUPLED PLASMA REACTOR WITH MULTIPLE MAGNETIC CORES

CROSS-REFERENCE TO RELATED APPLICATION

This application claims the benefit of Korean Patent Application No. 2006-36490, filed 24 Apr. 2006 and No. 2006-36879, filed 24 Apr. 2006 the disclosure of which is hereby incorporated herein by reference in its entirety.

BACKGROUND OF THE INVENTION

1. Technical Field

The present invention relates to a plasma reactor which generates an active gas including ions, free radicals, atoms and molecules by plasma discharge and performs plasma processing for solid, powder, gas, and the like, using the active gas, and more particularly, to an inductively coupled plasma reactor with multiple magnetic cores.

2. Discussion of Related Art

Plasma discharge is used for gas excitation to generate an active gas including ions, free radicals, atoms and molecules. An active gas is widely used in various fields. Typically, an active gas is used for a semiconductor fabrication process, for example, in various processes of etching, deposition, cleaning, and the like.

A wafer for semiconductor device fabrication or an LCD glass substrate has recently become larger in size. Therefore, a plasma source needs to have high capability of controlling plasma ion energy and to have easy expansibility with capability of processing a large area.

There are many plasma sources for generating plasma. Examples of the typical plasma sources include capacitively coupled plasma and inductively coupled plasma which use radio frequency. It is known that the inductively coupled plasma source is suitable for generating high density plasma because it relatively easily increases ion density as radio frequency power increases.

However, in the inductively coupled plasma, since the energy to be connected with plasma is low than the energy being supplied, a driving coil of a very high voltage is used. Therefore, as the ion energy is high, the inner surface of a plasma reactor is damaged by ion bombardment. The damage of the inner surface of the plasma reactor by the ion bombardment results in negative results of shortening a life of use of the plasma reactor and becoming a cause of contamination in plasma processing. When lowering the ion energy, since the energy connected with plasma is low, plasma discharge is frequently off. Therefore, it is difficult to stably maintain plasma.

In the processes using plasma for semiconductor fabrication, it is known that use of remote plasma sources is very useful. For example, the remote plasma is usefully applied in a cleaning process of a process chamber or an ashing process for photoresist strip. However, as a substrate to be processed becomes larger in size, a process chamber becomes larger in volume. Accordingly, a plasma source needs to be capable of sufficiently remotely supplying a high density active gas. For a multi-process chamber of processing a number of substrates simultaneously, the remote plasma source is increasingly required.

SUMMARY OF THE INVENTION

Therefore, the present invention is directed to provide an inductively coupled plasma reactor with multiple magnetic cores, which stably maintains plasma and stably generates high density plasma, by enhancing the efficiency of a heat transfer of inductively coupled energy to be connected with plasma.

In accordance with an exemplary embodiment, the present invention provides an inductively coupled plasma reactor comprising: a reactor body with a number of plasma discharge chambers; a transformer including a magnetic core, which is positioned across the plasma discharge chamber, and a primary winding; a core protecting tube for covering and protecting parts of the magnetic core which is positioned inside the plasma discharge chamber; and a power supply source connected to the primary winding, wherein a current of the primary winding is driven by the power supply source, the driving current of the primary winding induces AC potential which generates inductively coupled plasma to complete a secondary circuit of the transformer, and the inductively coupled plasma is formed in the plasma discharge chamber to cover the outside of the core protecting tube.

Preferably, the reactor body may comprise a gas entrance connected to at least one plasma discharge chamber, a gas exit connected to at least another plasma discharge chamber, and a connection path connecting the two plasma discharge chambers to each other.

Preferably, the reactor body may comprise a gas collecting region connected to at least two chamber connection paths.

Preferably, the reactor body may comprise a gas distributor for evenly distributing and supplying a gas to the gas entrance.

Preferably, the inductively coupled plasma reactor may comprise multiple discharge chambers including two or more separate multiple gas exits.

Preferably, the reactor body may be made of a metal material, and the metal material may include one or more electrically insulating regions to have electrical discontinuity in the metal material, to minimize an eddy current.

Preferably, the core protecting tube may be made of a dielectric material.

Preferably, the core protecting tube may include a metal material, and the metal material may include one or more electrically insulating regions to have electrical discontinuity in the metal material, to minimize the eddy current.

Preferably, the inductively coupled plasma reactor may comprise multiple discharge chambers which include a cooling water supplying channel positioned inside the core protecting tube.

Preferably, the cooling water supplying channel may include a metal material, and the metal material may include one or more electrically insulating regions to have electrical discontinuity in the metal material, to minimize the eddy current.

Preferably, the inductively coupled plasma reactor may comprise a cooling water supplying channel which is formed through the center of the magnetic core.

Preferably, the inductively coupled plasma reactor may comprise an impedance matcher performing impedance matching, which is formed between the power supply source and the primary winding.

Preferably, the power supply source may be operated without any adjustable matcher.

Preferably, the inductively coupled plasma reactor may further comprise a process chamber for receiving and storing a plasma gas generated in the reactor body.

Preferably, the reactor body may have a structure to be mounted on the process chamber, the power supply source may have a structure to be physically separated from the reactor body, and the power supply source and the reactor body may be remotely connected by a power connection cable.

Preferably, the gas flowing into the plasma discharge chamber may be selected a group including an inert gas, a reaction gas, and a mixture of these.

In accordance with another exemplary embodiment, the present invention provides an inductively coupled plasma reactor comprising: a reactor body forming a plasma discharge chamber and including a gas entrance and a gas exit; a transformer including a magnetic core, which have two or more core cross sectional parts crossing the inside of the plasma discharge chamber and parts of magnetic core positioned outside of the plasma discharge chamber, and a primary winding wound about the magnetic core; a core protecting tube for covering the two or more core cross sectional parts positioned inside the plasma discharge chamber; and a power supply source electrically connected to the primary winding, wherein a current of the primary winding is driven by the power supply source, the driving current of the primary winding induces AC potential inside the plasma discharge chamber which generates inductively coupled plasma to complete a secondary circuit of the transformer, and the inductively coupled plasma is formed in a multistage type in the plasma discharge chamber to cover the outside of the core protecting tube, focusing on the two or more core cross sectional parts.

Preferably, any one of the two or more core cross sectional parts may be positioned to be at right angles or in parallel to a gas flow path inside the plasma discharge chamber.

Preferably, the magnetic core may be an integrated multiple loop type magnetic core.

Preferably, the magnetic core may be a single loop magnetic core having a single loop.

Preferably, the magnetic core may have a structure in which the parts of magnetic core are mounted to be exposed outside a sidewall of the reactor body.

Preferably, the reactor body may comprise a sidewall chamber for receiving the parts of magnetic core, and the parts of the magnetic core may have a structure to be mounted in the sidewall chamber of the reactor body.

Preferably, the core protecting tube may comprise a single core protecting tube to be independently mounted on each core cross sectional part, and the reactor body may include a number of apertures, where both ends of the single core protecting tube are positioned, and a vacuum-insulating member of vacuum-insulating contact parts of the single core protecting tube and the apertures.

Preferably, the core protecting tube may include an integrated multiple core protecting tube, in which both ends of each core protecting tube are integrated in a structure of one flange, and the reactor body may include apertures, where parts of the flange of the integrated multiple core protecting tube are positioned, and a vacuum-insulating member of vacuum-insulating contact parts of the flange of the integrated multiple core protecting tube and the apertures.

Preferably, the core protecting tube may comprise a single core protecting tube to be independently mounted on each core cross sectional part, and the sidewall chamber of the reactor body may include a number of apertures, where both ends of each of the two or more single core protecting tubes are positioned, and a vacuum-insulating member of vacuum-insulating contact parts of the two or more core protecting tubes and the apertures.

Preferably, the core protecting tube may include an integrated multiple core protecting tube, in which both ends of each core protecting tube are integrated in a structure of one flange, and the sidewall chamber of the reactor body may include apertures, where parts of the flange of the integrated multiple core protecting tube are positioned, and a vacuum-insulating member of vacuum-insulating contact parts of the flange of the integrated multiple core protecting tube and the apertures.

Preferably, the core protecting tube may be made of a dielectric material.

Preferably, the core protecting tube may be made of a metal material, and the metal material may include one or more electrically insulating regions to have electrical discontinuity in the metal material, to minimize an eddy current.

Preferably, the reactor body may be made of a metal material and the metal material may include one or more electrically insulating regions to have electrical discontinuity in the metal material, to minimize the eddy current.

Preferably, the inductively coupled plasma reactor may comprise a cooling water supplying channel positioned inside the core protecting tube.

Preferably, the inductively coupled plasma reactor may comprise a cooling water supplying channel which is formed through the center of the magnetic core.

Preferably, the inductive coupled plasma reactor may comprise a capacitively coupled electrode positioned inside each core protecting tube, the capacitively coupled electrode may be wound about the core cross sectional parts, a number of turns, to function as a secondary winding of the transformer, and at least two capacitively coupled electrodes induce mutual inverse voltages to be capacitively coupled together.

Preferably, the inductive coupled plasma reactor may comprise an induction voltage controlling circuit for variably controlling a voltage induced to the capacitively coupled electrode.

Preferably, the inductively coupled plasma reactor may comprise an impedance matcher performing impedance matching, which is formed between the power supply source and the primary winding.

Preferably, the power supply source may be operated without any adjustable matcher.

Preferably, the inductively coupled plasma reactor may comprise two or more separate multiple gas exits.

Preferably, the inductively coupled plasma reactor may further comprise a process chamber for receiving and storing a plasma gas generated in the reactor body.

Preferably, the reactor body may have a structure to be mounted in the process chamber, the power supply source may have a structure to be physically separated from the reactor body, and the power supply source and the reactor body may be remotely connected by a radio frequency cable.

Preferably, the reactor body may further comprise a process chamber to be connected thereto in one body.

Preferably, the gas flowing into the plasma discharge chamber may be selected a group including an inert gas, a reaction gas, and a mixture of these.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention and the operational advantages and objects of the present invention will now be described more fully hereinafter with reference to the accompanying drawings, in which preferred embodiments of the invention are shown. Like numbers refer to like elements throughout the specification. When the function and constitution are well-known in the relevant arts, further discussion will not be presented in the detailed description or illustration of the present invention in order not to unnecessarily make the gist of the present invention unclear.

Embodiment 1

Figure 1:
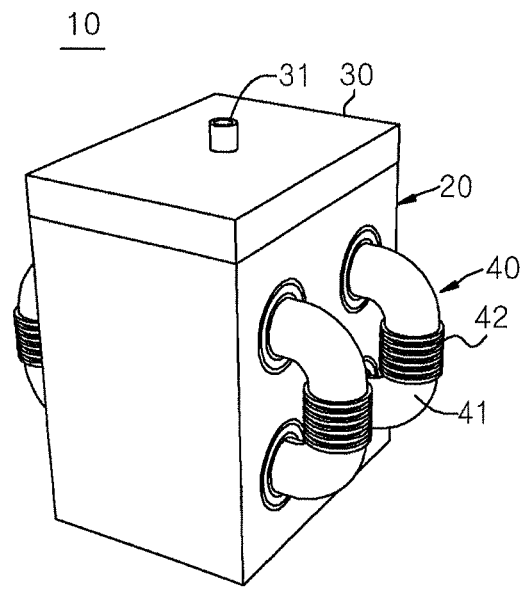
FIG. 1 is a perspective view of a plasma reactor according to a first embodiment of the present invention.
Figure 2A:
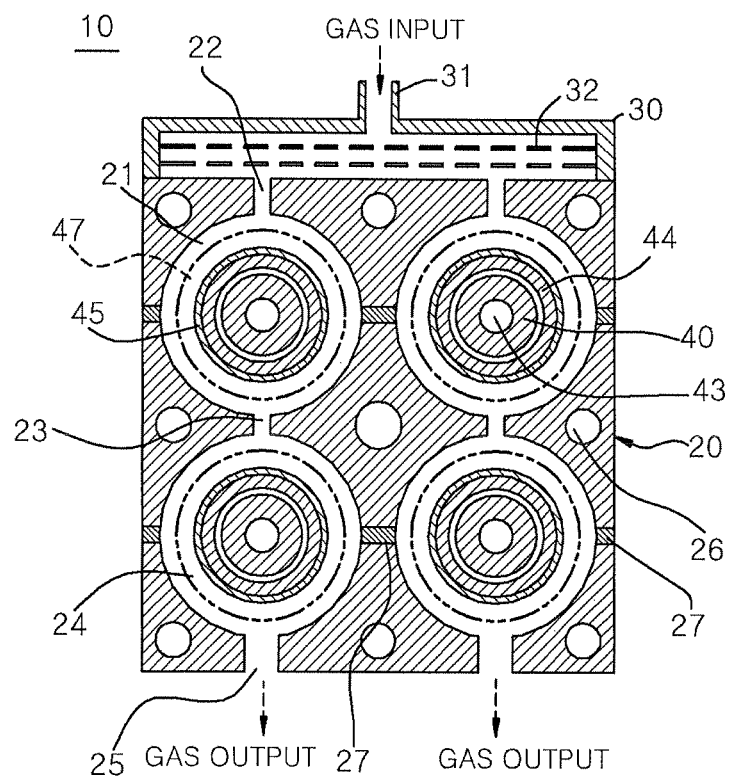
FIGS. 2A and 2B are respectively a front sectional view and a side sectional view of the plasma reactor of FIG. 1.
Figure 2B:
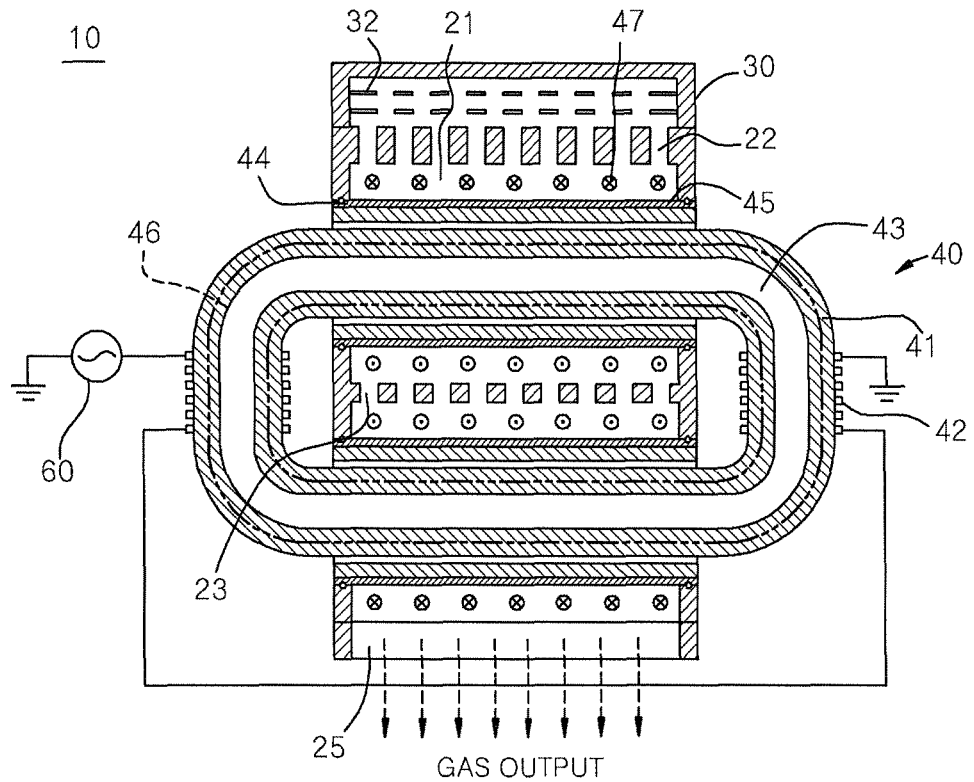

A plasma reactor with multiple discharge chambers of the present invention will be described with reference to the attached drawings:

FIG. 1 is a perspective view of a plasma reactor according to a first embodiment of the present invention; and FIGS. 2A and 2B are respectively a front sectional view and a side sectional view of the plasma reactor of FIG. 1.

Referring to FIGS. 1, 2A and 2B, the plasma reactor 10 comprises a reactor body 20 with a number of independent plasma discharge chambers 21. The reactor body 20 is connected to a transformer 40 for transferring an electromotive force for plasma discharge to the plasma discharge chamber 21. The transformer 40 includes a magnetic core 41 and a primary winding 42 which are positioned across the plasma discharge chamber 21. The magnetic core 41, which is positioned inside the plasma discharge chamber 21, is wound by a core protecting tube 45, to be protected on the whole. The primary winding 42 is electrically connected to a power supply source 60 for providing radio frequency power.

For example, two of the plasma discharge chambers 21 are positioned in parallel at an upper position of the plasma reactor 10 and two of the plasma discharge chambers 21 are positioned in parallel at a lower position of the plasma reactor 10. Totally, four plasma discharge chambers 21 are arranged in two stages in parallel. The reactor body 20 has gas entrances 22 with a number of holes which are opened towards the two plasma discharge chambers 21 positioned at the upper position of the plasma reactor 10. The reactor body 20 further has gas exits 25 opened downward in the two plasma discharge chamber 21 positioned at the lower position of the plasma reactor 10. The reactor body 20 further has connection paths 23 with a number of holes which connect the plasma discharge chambers 21 at the upper and lower positions to each other. A gas flow path, which passes through a number of the plasma discharge chamber 21 positioned in multistage arrangement and in parallel, is formed between the gas entrance 22 and the gas exit 25.

To uniformly supply a gas, a gas distributor 30 may be set up at the upper position of the reactor body 20. The gas distributor 30 includes a gas entrance 31 connected to a gas supply source (not shown) and one or more gas distributing plates 32 to evenly distribute the gas. The gas flowing into the plasma discharge chamber 21 is selected from a group including an inert gas, a reaction gas, and a mixture of these. Alternatively, other gases suitable for other plasma processes may be selected.

The reactor body 20 is vacuum-insulated by a vacuum-insulating member 44 at its part which is in contact with the core protecting tube 45. The reactor body 20 is made of metal material, for example, aluminum, stainless or copper. Alternatively, the reactor body 20 may be made of coated metal, for example, anodized aluminum, or aluminum coated with nickel. Alternatively, the reactor body 20 may be made of refractory metal. Alternatively, the reactor body 20 may be made of insulating material, such as quartz or ceramic or may be made of any other material that is suitable for performing an intentioned plasma process.

When the reactor body 20 is made of the metal material, one or more electrically insulating region 27 which has electrical discontinuity in the metal material is included to minimize the eddy current. For example, the insulating region 27 may be formed to cross each plasma discharge chamber 21 as shown.

The magnetic core 41 is shared in at least two plasma discharge chamber 21. A part of the magnetic core 41 is mounted so as to be externally exposed out of the reactor body 20. The magnetic core 41 is made of ferrite material but may be made of other materials, such as iron and air.

The core protecting tube 45 is made of dielectric material, such as quartz or ceramic. The core protecting tube 45 may be made of the same metal material as that of the reactor body 20 described above. In this case, the core protecting tube 45 includes one or more electrically insulating region with the electrical discontinuity to prevent the eddy current.

Figure 3:
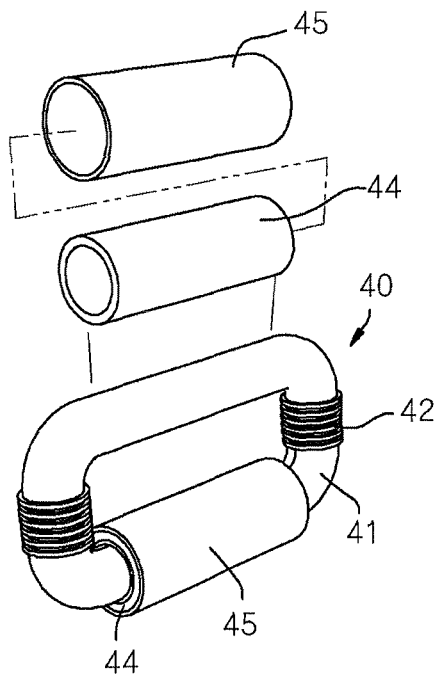
FIG. 3 is an exploded perspective view illustrating a core protecting tube and a cooling tube to be mounted in a magnetic core.
Figure 4A:
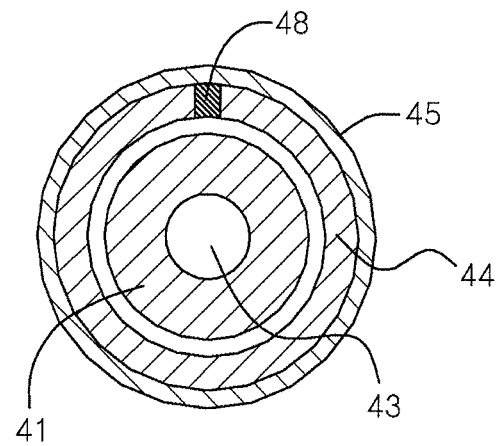
FIGS. 4A and 4B are sectional views illustrating the magnetic core in which the core protecting tube and cooling tube are mounted.
Figure 4B:
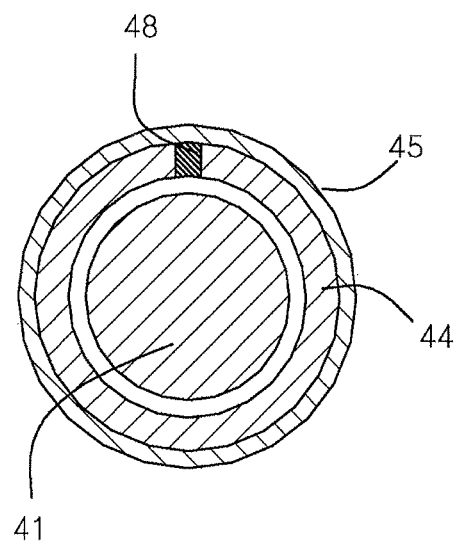

FIG. 3 is an exploded perspective view illustrating the core protecting tube 45 and a cooling tube to be mounted in the magnetic core 42, and FIGS. 4A and 4B are sectional views illustrating the magnetic core in which the core protecting tube and cooling tube are mounted.

Referring to FIGS. 3, 4A and 4B, a cooling water supply conduit 44 for forming a cooling water supplying channel is mounted in the magnetic core 41. Alternatively, a cooling water supplying channel 43 may be formed through the center of the magnetic core 42. Alternatively, the cooling water supplying channel 43 may be formed the center of both the cooling water supply conduit 44 and the magnetic core 41. Alternatively, a number of cooling channels 26 may be formed in the reactor body 20. FIG. 4A is a sectional view illustrating the cooling water supplying channel 43 formed in the center of the magnetic core 41 and the cooling water supplying conduit 44 positioned inside of the core protecting tube 45. FIG. 4B is a sectional view the cooling water supplying conduit 44 only positioned. The cooling water supplying conduit 44 may be made of metal material and, in this case, the cooling water supplying conduit 44 may have an insulating region 48 to prevent the eddy current from being induced.

Referring back to FIGS. 2A and 2B, a current of the primary winding 42 is driven by the power supply source 60. The driving current of the primary winding 42 induces AC potential inside the plasma discharge chamber 21 of forming inductively coupled plasma, to complete a secondary circuit of the transformer 50. Then, the inductively coupled plasma is formed in each plasma discharge chamber 21, to cover the outside of the core protecting tube 45, focusing on a core cross sectional part. Reference numeral '46' indicates an induced electric field induced by the magnetic core 41, and reference numeral '47' indicates an electric field secondarily induced by the induced electric field 46.

The power supply source 60 is constituted by using a RF power supply source which is capable of controlling an output voltage, without using any additional impedance matcher. Alternatively, the power supply source 60 may be constituted by using the RF power supply source which matches impedance by an additional impedance matcher.

In the plasma reactor 10, the efficiency of transferring the inductively coupled energy which is connected with plasma is very high because a number of magnetic core cross sectional parts are positioned inside the plasma discharge chamber 21. Furthermore, since the plasma discharge chambers 21 are positioned in multistage arrangement, high density plasma is easily produced without excessively increasing radio frequency.

Figure 5A:
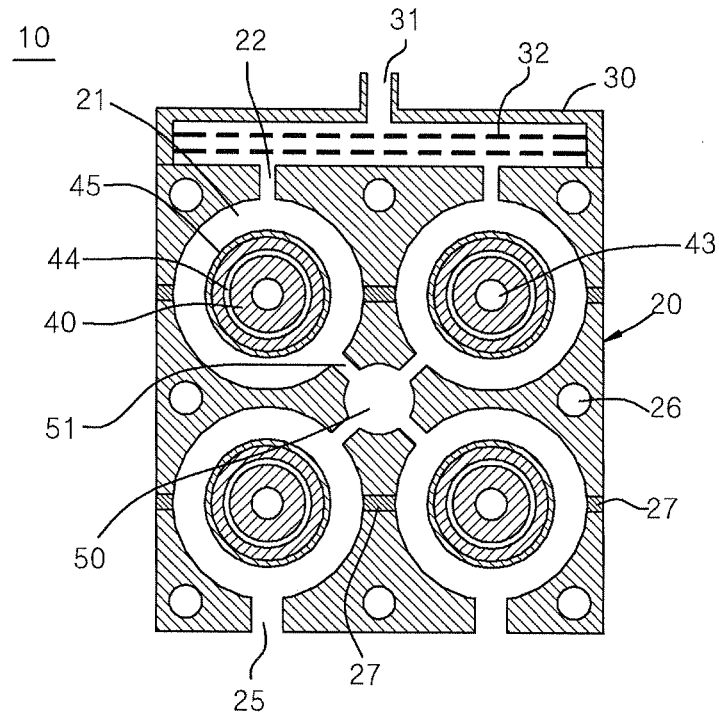
FIGS. 5A through 5C are front sectional views illustrating various modified examples of a gas flow path.
Figure 5B:
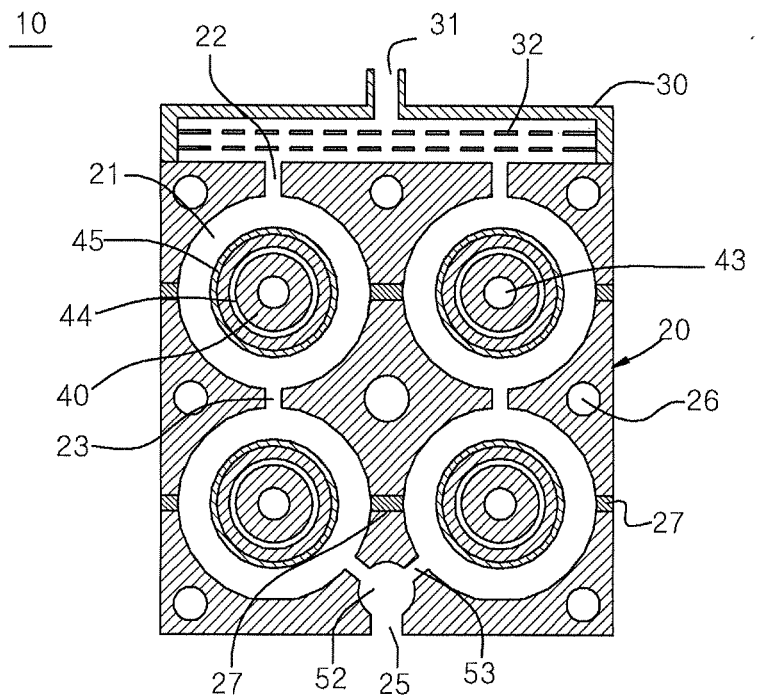
Figure 5C:
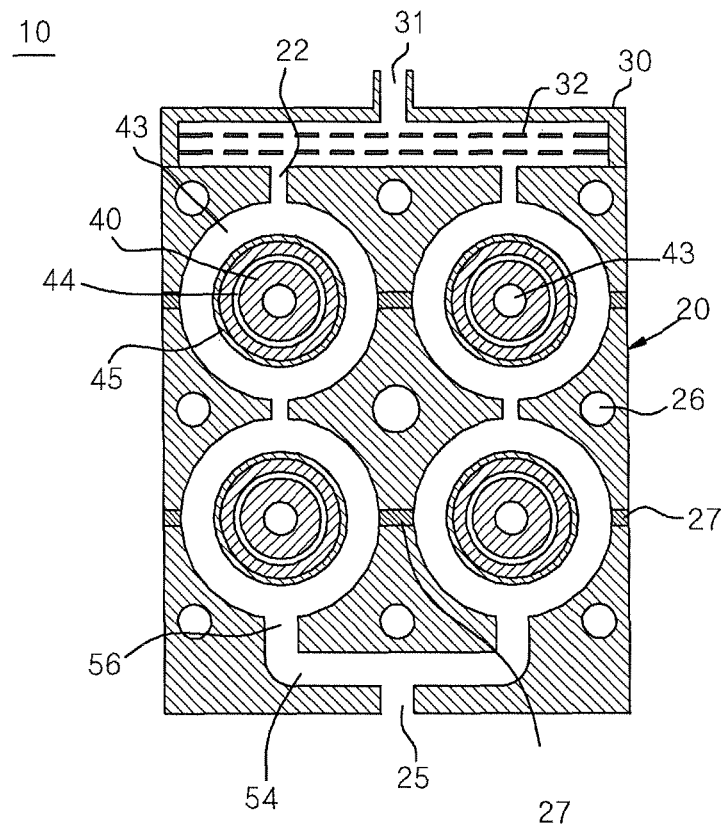
Figure 6A:
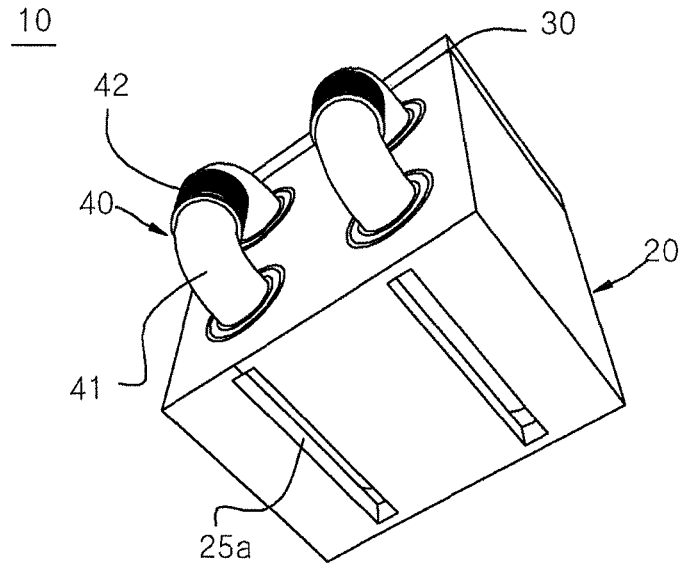
FIGS. 6A and 6B are bottom perspective views illustrating examples of a gas exit.
Figure 6B:
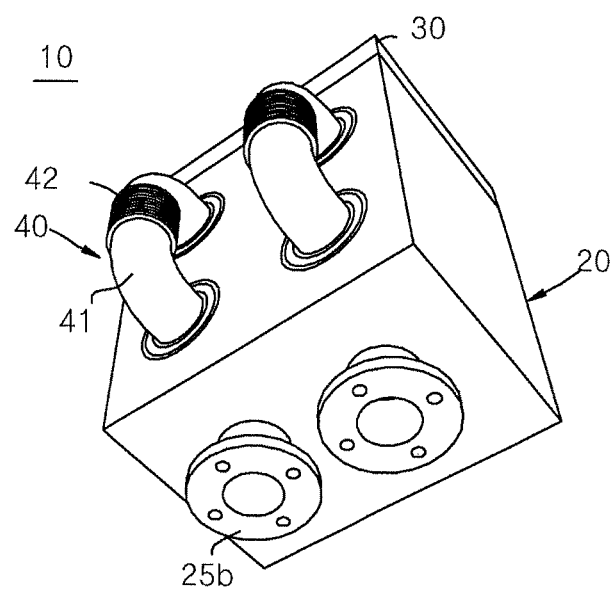

FIGS. 5A through 5C are front sectional views illustrating various modified examples of the gas flow path, and FIGS. 6A and 6B are bottom perspective views illustrating examples of the gas exit.

FIG. 5A illustrates a modified example in which a gas collecting region 50 may be formed in the middle of four plasma discharge chambers 21. A plasma gas generated in the two plasma discharge chambers 21 positioned at the upper stage is collected in the gas collecting region 50 and then is dispersed and input into the plasma discharge chambers 21 positioned at the lower stage.

FIG. 5B illustrates another modified example in which a gas collecting region 52 may be formed under the two plasma discharge chambers 21 positioned at the lower stage. The plasma gas generated in the two plasma discharge chambers 21 positioned at the lower stage is collected in the gas collecting region 52 and is output through one gas exit 25.

FIG. 5C illustrates another modified example in which one gas exit 25 is formed and a gas exhaust path 54 is formed to be connected the two plasma discharge chambers 21 positioned at the lower stage.

The gas exit 25 may be formed in a gas exit 25a in a slit shape which is long and narrowly opened under the reactor body 20 as illustrated in FIG. 6A. Alternatively, the gas exit 25 may be formed in a round gas exit 26b which includes a flange structure as illustrated in FIG. 6B.

Figure 7:
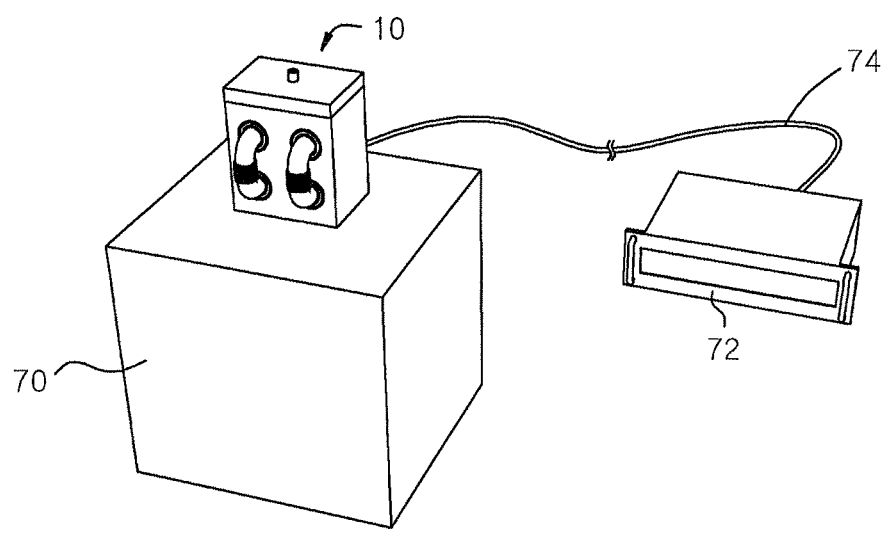
FIG. 7 is a view of an example in which the plasma reactor is mounted in a process chamber.
Figure 8A:
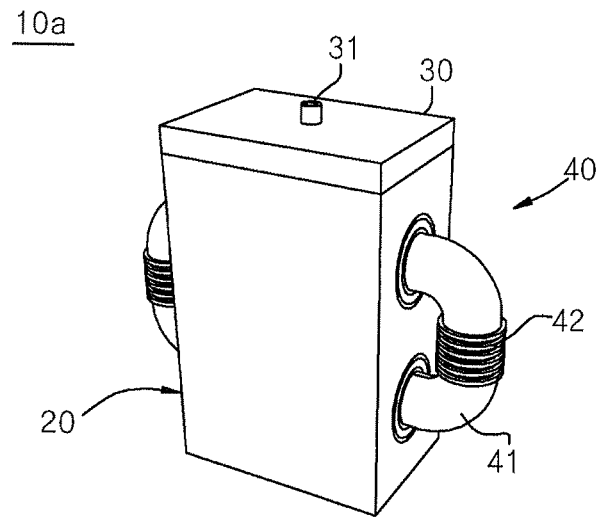
FIGS. 8A through 8D are views illustrating modified examples of the plasma reactor according to the first embodiment of the present invention.
Figure 8B:
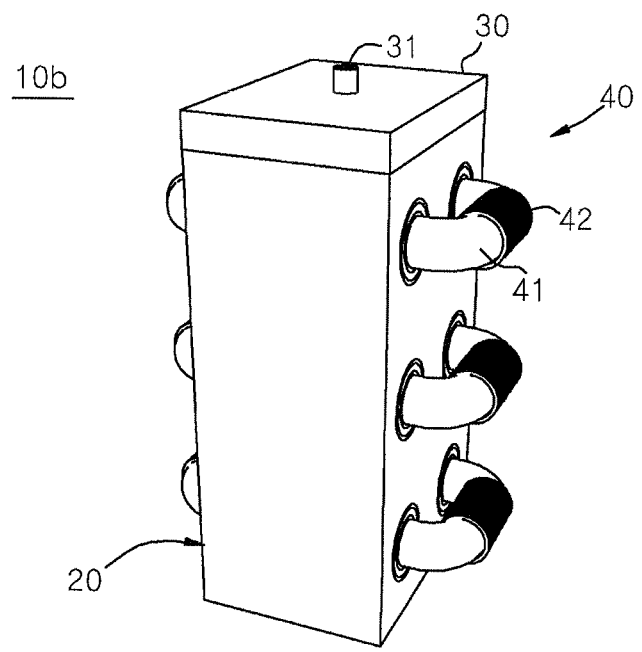
Figure 8C:
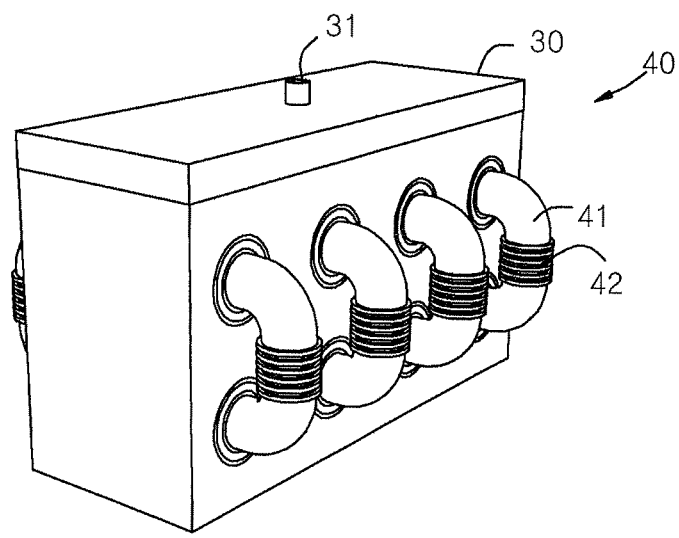
Figure 8D:
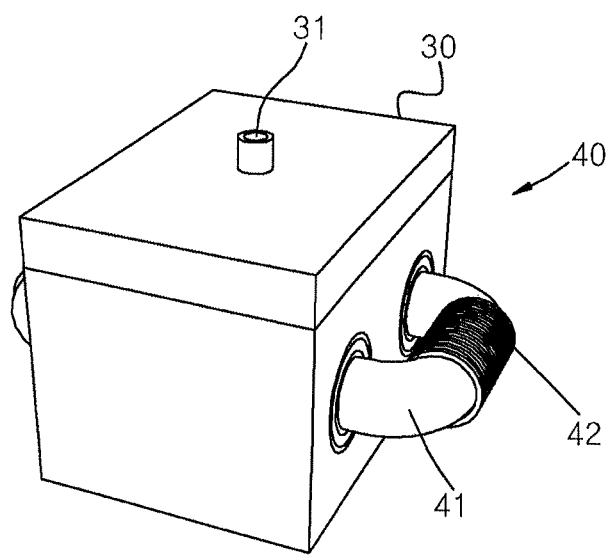

FIG. 7 is a view of an example in which the plasma reactor is mounted in a process chamber 70.

Referring to FIG. 7, the plasma reactor 10 is mounted in the process chamber 70 and remotely supplies plasma into the process chamber 70. For example, the plasma reactor 10 may be mounted onto the outside of the ceiling of the process chamber 70. RF frequency is provided from a RF frequency generator 72 to the plasma reactor 10 and a gas is supplied from a gas supply system (not shown) into the plasma reactor 10 so that the plasma reactor 10 generates an active gas.

The process chamber 70 receives the active gas generated in the plasma reactor 10 and performs a predetermined plasma process. The process chamber 70 may be, for example, a deposition chamber for performing a deposition process or an etching chamber for an etching process. Or the process chamber 70 may be an ashing chamber for stripping photoresist. In addition, the process chamber 70 may be a plasma process chamber for performing various processes for semiconductor fabrication.

Specifically, the plasma reactor 10 is separated, in structure, from the RF frequency generator 72 which is the power supply source for supplying the RF power. That is, the plasma reactor 10 is constituted to be fixedly mountable into the process chamber, and the RF frequency generator 72 is constituted to be separable from the plasma reactor 10. An output terminal of the RF frequency generator 72 is remotely connected to a RF frequency input terminal of the plasma reactor 10 by a RF frequency cable 74. Therefore, unlike a conventional art in which the RF frequency generator and the plasma reactor are constituted as one unit, in the present invention the RF frequency generator 72 and the plasma reactor 10 are very easily installed in the process chamber 70, thereby enhancing the efficiency of maintenance of the system.

FIGS. 8A through 8D are views illustrating modified examples of the reactor according to the first embodiment of the present invention. In various plasma reactors 10a, 10b, 10c and 10d according to the modified examples shown in FIGS. 8A through 8D, two plasma discharge chambers are vertically positioned (in FIG. 8A) or horizontally positioned (in FIG. 8D), or a number of plasma discharge chambers are vertically positioned in parallel (in FIG. 8B) or horizontally positioned in parallel (in FIG. 8C).

In addition to these modified examples, any further various modifications within the scope of the present invention will be obvious to persons skilled in the art.

Embodiment 2

Figure 9:
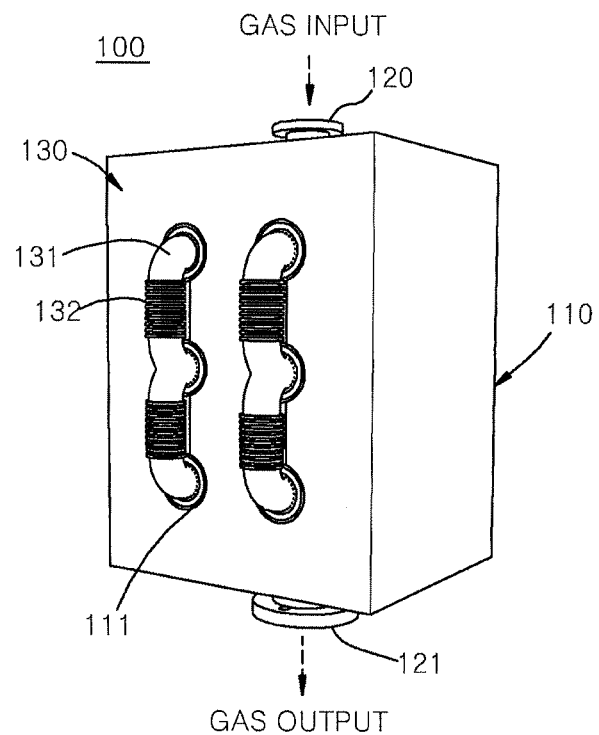
FIG. 9 is a perspective view of a plasma reactor according to a second embodiment of the present invention.
Figure 10:
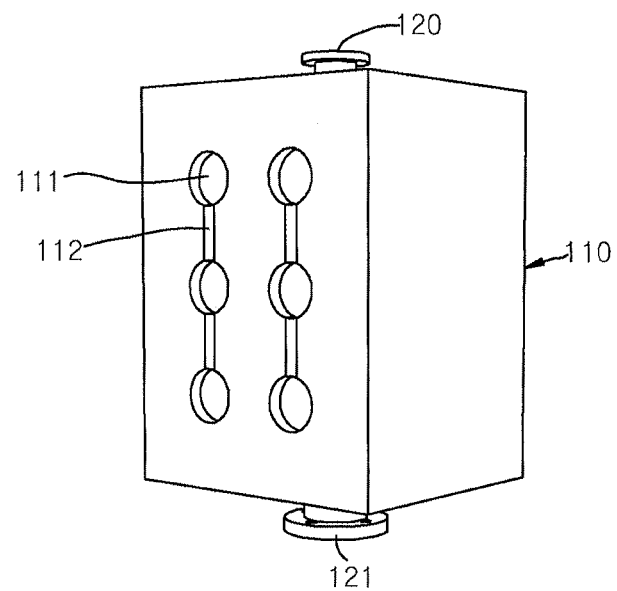
FIG. 10 is a perspective view illustrating the constitution of a reactor body of the plasma reactor of FIG. 9.
Figure 11:
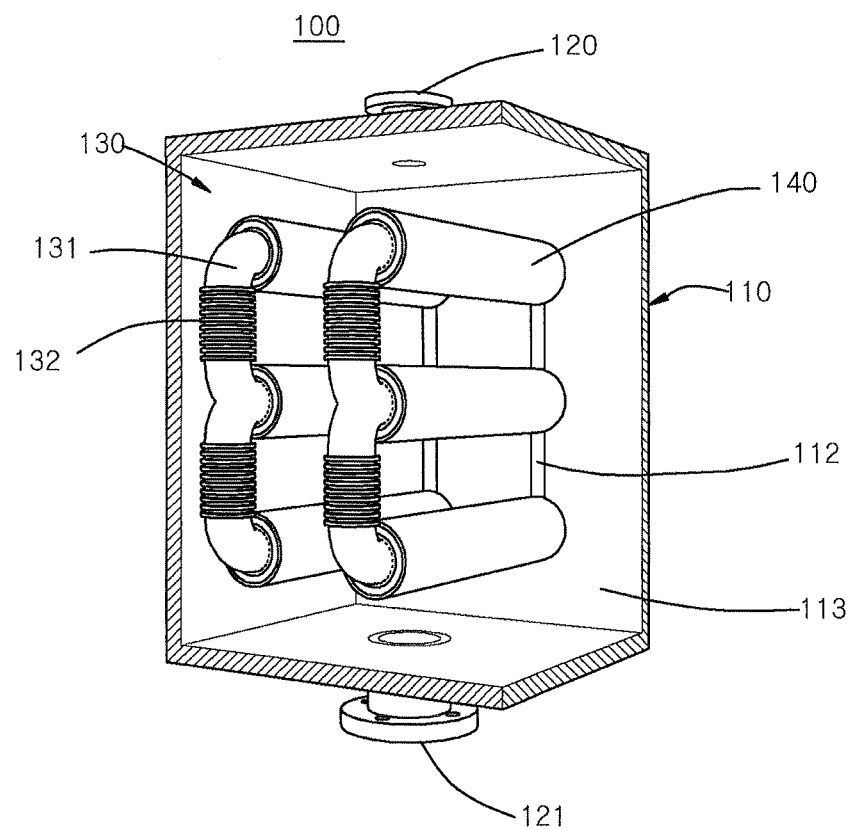
FIG. 11 is a partial exploded perspective view illustrating an inside of the plasma reactor of FIG. 9.

FIG. 9 is a perspective view of a plasma reactor according to a second embodiment of the present invention, FIG. 10 is a perspective view illustrating the constitution of a reactor body of the plasma reactor of FIG. 9, and FIG. 11 is a partial exploded perspective view illustrating an inside of the plasma reactor of FIG. 9.

Referring to FIGS. 9, 10 and 11, the plasma reactor 100 comprises a reactor body 110 which forms a plasma discharge chamber 113 and includes a gas entrance 120 and a gas exit 121. A transformer 130 comprises a magnetic core 131 and a primary winding 132. The magnetic core 131 includes two or more core cross sectional parts which are across the inside of the plasma discharge chamber 113, and parts of the magnetic core 131 which are positioned outside the plasma discharge chamber 113. The primary winding 132 is wound around the magnetic core 131 and is electrically connected to a power supply source 133 (in FIG. 13).

The power supply source 13 is constituted by using a RF power supply source which is capable of controlling an output voltage, without using any additional impedance matcher. Alternatively, the power supply source may be constituted by using a RF power supply source with an impedance matcher.

A gas flowing into the plasma discharge chamber 113 is selected from a group of inert gas, reaction gas, and a mixture of these. Or any other gases suitable for other plasma processes may be selected as the gas flowing into the plasma discharge chamber 113.

The reactor body 110 has a number of apertures 111 at which both ends of a single core protecting tube 140 are positioned. Contact parts of the single core protecting tube 140 and the apertures 111 are vacuum-insulated by a vacuum-insulating member 101 (in FIG. 13). The reactor body 110 is made of metal material, for example, aluminum, stainless or copper. The reactor body 10 may be made of coated metal, for example, anodized aluminum or aluminum coated with nickel. The reactor body 10 may be made of refractory metal. Alternatively, the reactor body 10 may be made of insulating material, such as quartz or ceramic or any other material suitable for performing an intentioned plasma process.

Figure 15A:
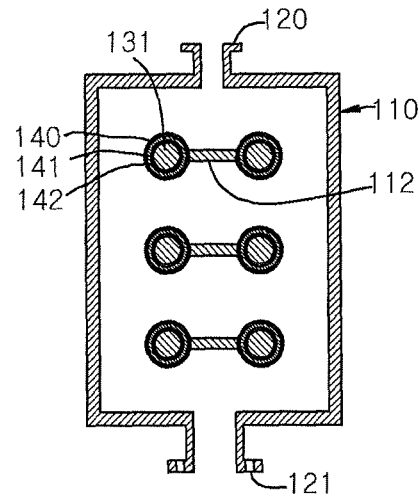
FIGS. 15A through 15D are views illustrating various modified examples of a structure of an insulating region to block an eddy current.
Figure 15B:
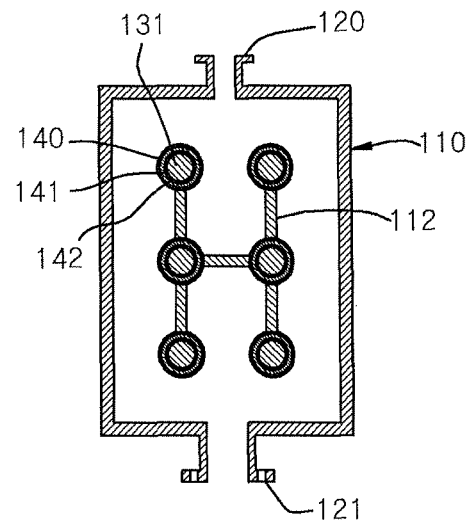
Figure 15C:
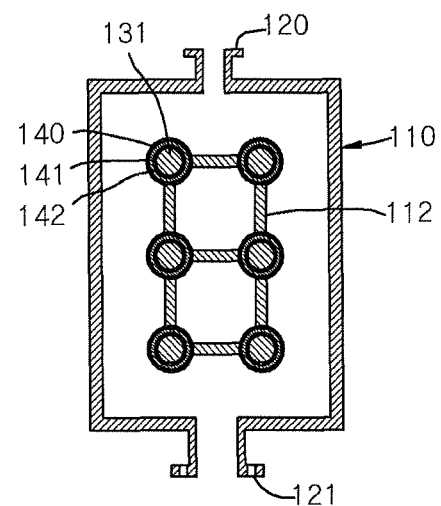
Figure 15D:
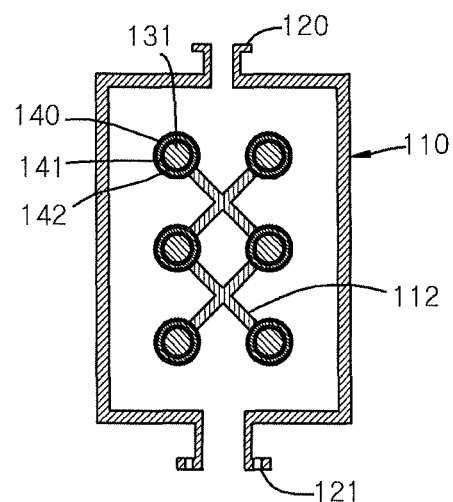

When the reactor body 110 includes the metal material, it includes one or more electrically insulating region 112 to have the electrical discontinuity in the metal material, to minimize the eddy current. The electrically insulating layer 112 may be formed in various shapes as shown in FIGS. 15 through 15D.

The parts of the magnetic core 131 are exposed to be mounted outside the sidewall of the reactor body 110. The magnetic core 131 is formed in an integrated multiple loop type, for example, two-stage multiple loops. However, the magnetic core 131 may use an independent single loop type. The magnetic core 131 may be made of ferrite material but, alternatively, may be made of other materials, such as iron and air.

The two or more core cross sectional parts positioned inside the plasma discharge chamber 113 are protected by being covered by the core protecting tube 140 in a tube type. The core protecting tube 140 is independently mounted on each core cross sectional part. The core protecting tube 140 is made of dielectric material, such as quartz or ceramic. Or, the core protecting tube 140 may be made of the same metal material as that of the reactor body 110 as described above, and, in this case, includes one or more electrically insulating regions to have the electrical discontinuity to prevent the eddy current.

Figure 12:
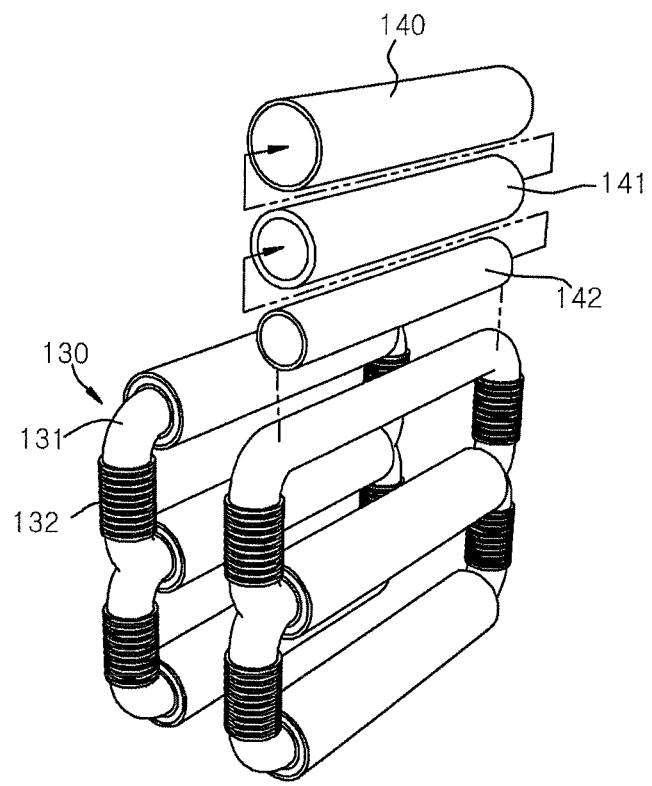
FIG. 12 is an exploded perspective view illustrating the constitution of a core protecting tube, a cooling tube and a capacitively coupled electrode to be mounted in a magnetic core of FIG. 9.

FIG. 12 is an exploded perspective view illustrating the constitution of the core protecting tube, a cooling tube and a capacitively coupled electrode 142 to be mounted in the magnetic core of FIG. 9.

In FIG. 12, a cooling water supplying conduit 14 for forming a cooling water supplying channel is mounted in the magnetic core 131. Alternatively, the cooling water supplying channel may be formed through the center of the magnetic core 131. Or, the cooling water supplying channel may be formed in both the cooling water supplying conduit 141 and the center of the magnetic core 131. Or, the cooling water supplying channel may be formed in the reactor body 110. The capacitively coupled electrode 142 is mounted in the magnetic core 131. The capacitively coupled electrode 142 is selectively mounted, and more detailed description thereof will be presented later.

Figure 13:
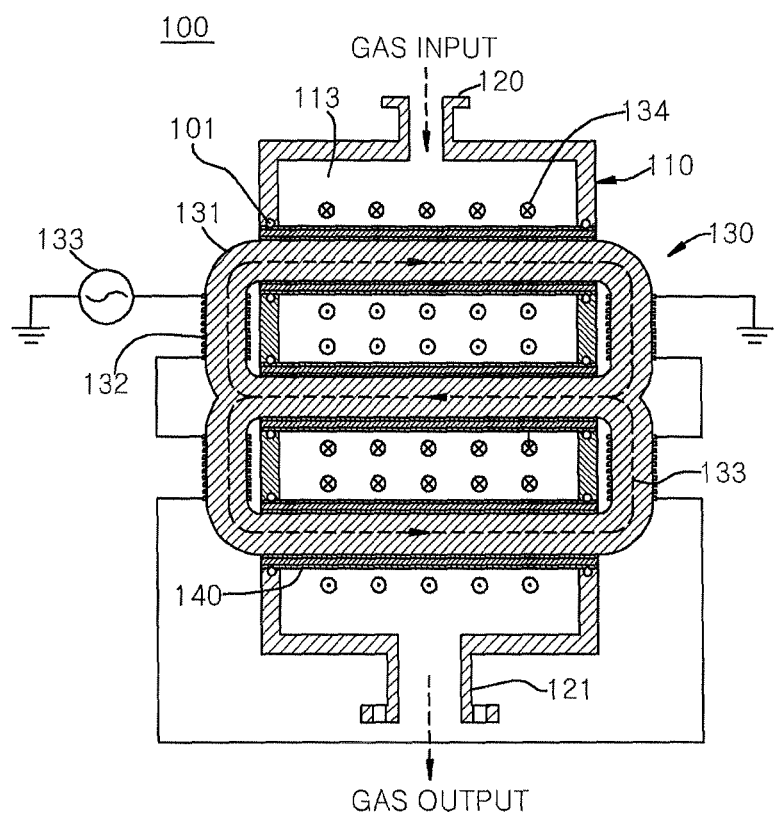
FIG. 13 is a sectional view of the plasma reactor for visually illustrating an electrical connection of a transformer and a magnetic field and an electric field induced by the transformer.
Figure 14:
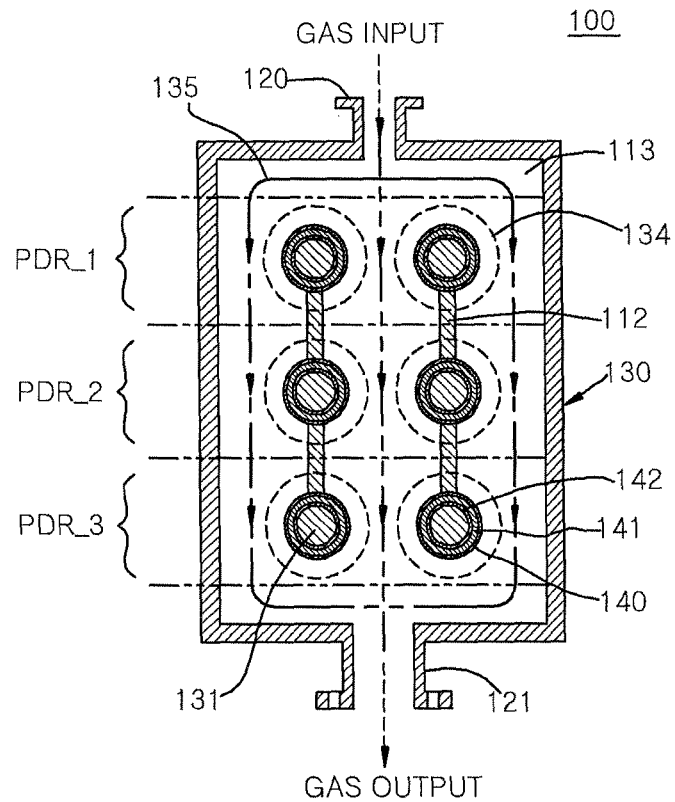
FIG. 14 is a sectional view of a multistage plasma discharge region of the plasma reactor.

FIG. 13 is a sectional view of the plasma reactor for visually illustrating an electrical connection of the transformer and a magnetic field and an electric field induced by the electrical connection of the transformer. FIG. 14 is a sectional view of a multistage plasma discharge region of the plasma reactor.

In FIGS. 13 and 14, a current of the primary winding 132 is driven by the power supply source 133. The driving current of the primary winding 132 induces AC potential inside the plasma discharge chamber 113 which generates inductively coupled plasma to complete a secondary circuit of the transformer 130. Then, the inductively coupled plasma is formed in a multistage type in the plasma discharge chamber 113, to cover the outside of the core protecting tube 140, focusing on the two or more core cross sectional parts. In the plasma discharge chamber 113, a gas flow path 153 is formed along the multistage plasma discharge regions PDR_1, PDR_2 and PDR_3.

As illustrated, the two or more core cross sectional parts are positioned so as to be at right angles to the gas flow path 153 inside the plasma discharge chamber 113. However, alternatively, the two or more core cross sectional parts may be positioned so as to be horizontally.

Figure 16:
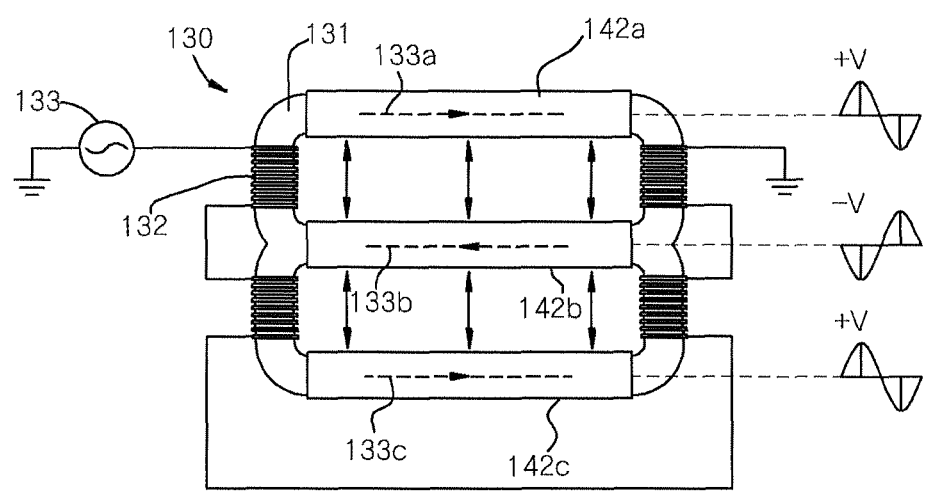
FIG. 16 is a view for explaining a phase relation of a voltage induced to a capacitively coupled electrode.

FIG. 16 is a view for explaining a phase relation of a voltage induced to the capacitively coupled electrode.

In FIG. 16, the capacitively coupled electrode 142 is wound about the core cross sectional parts a number of turns, thereby functioning as a secondary winding of the transformer 130. At least two or more capacitively coupled electrodes 142a, 142b and 142c are capacitively coupled by inverse voltages V+ and V− which are induced therebetween.

For example, a number of primary windings 132 are wound about the three core cross sectional parts in a proper direction, so that adjacent core cross sectional parts induce electric fields 133*a*, 133*b* and 133*c* which are opposite to one another. Therefore, the three capacitively coupled electrodes 142*a*, 142*b* and 142*c* induce the mutual inverse voltages V+ and V−.

Figure 17:
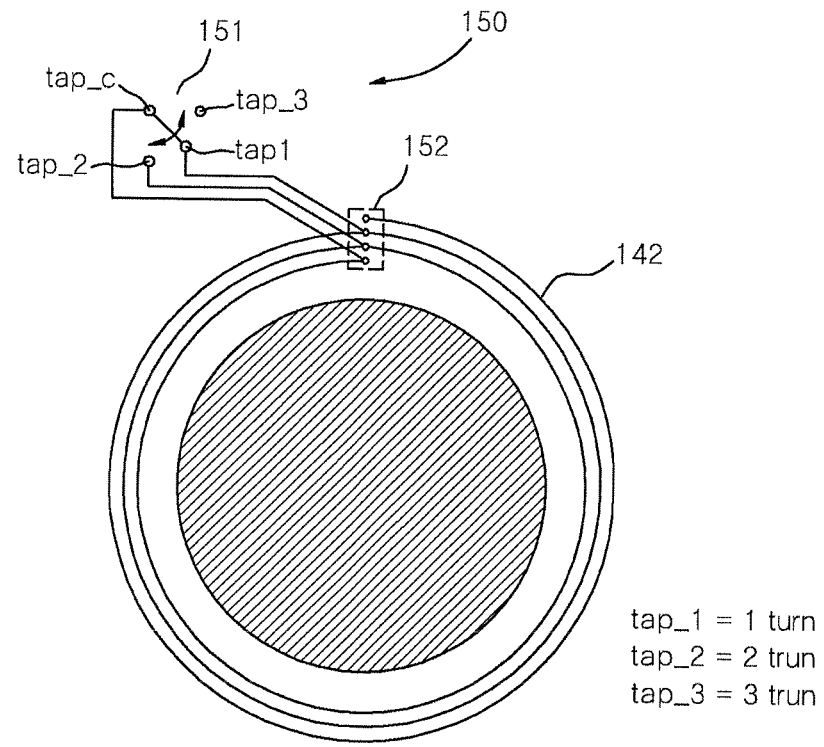
FIG. 17 is a view illustrating the constitution of an induction voltage controlling circuit of the capacitively coupled electrode.

FIG. 17 is a view illustrating the constitution of an induction voltage controlling circuit of the capacitively coupled electrode.

In FIG. 17, the induction voltage controlling circuit 150 comprises a switching circuit 151 for varying the number of winding by switching a multi tap 151 and a multi tap to vary the number of winding of the capacitively coupled electrode 142. The number of winding is varied as the switching circuit 151 is switched. The level of a voltage induced to the capacitively coupled electrode 142 is varied as the number of winding is varied.

In the above-described inductively coupled plasma reactor of the present invention, the efficiency of transferring the inductively coupled energy to be connected with plasma is very high because a number of magnetic core cross sectional parts are positioned inside the plasma discharge chamber 113. Further, since the capacitively coupled electrode 142 is constituted to additionally provide the variable capacitively coupled energy to be connected with plasma, the plasma is stably maintained and the plasma ion density and ion energy are easily controlled. The capacitively coupled electrode 142 may be selectively used only when igniting plasma at the beginning of driving the plasma reactor 100 or may be used to control the plasma ion density and ion temperature after the plasma ignition.

Figure 18:
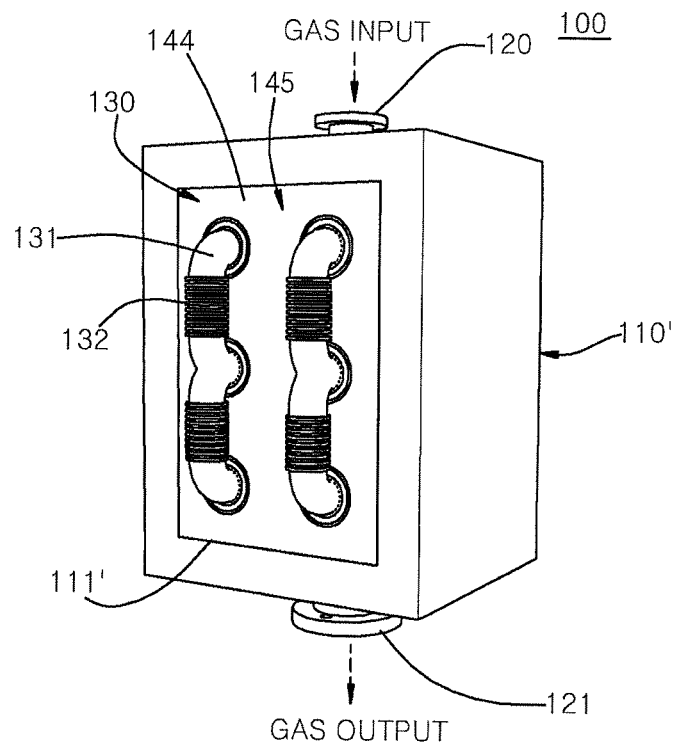
FIG. 18 is a perspective view of a plasma reactor according to a modified embodiment.
Figure 19:
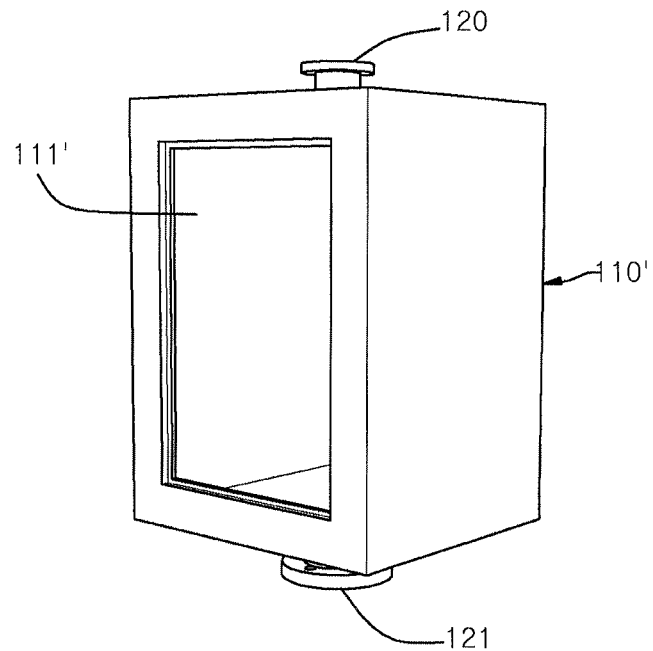
FIG. 19 is a perspective view illustrating a structure of a reactor body of the plasma reactor of FIG. 18.
Figure 20:
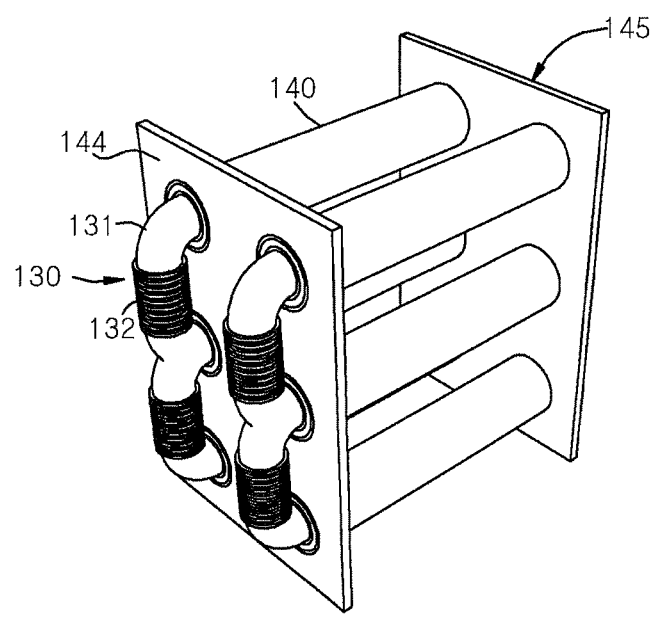
FIG. 20 is a perspective view of a core protecting tube of FIG. 18.
Figure 21:
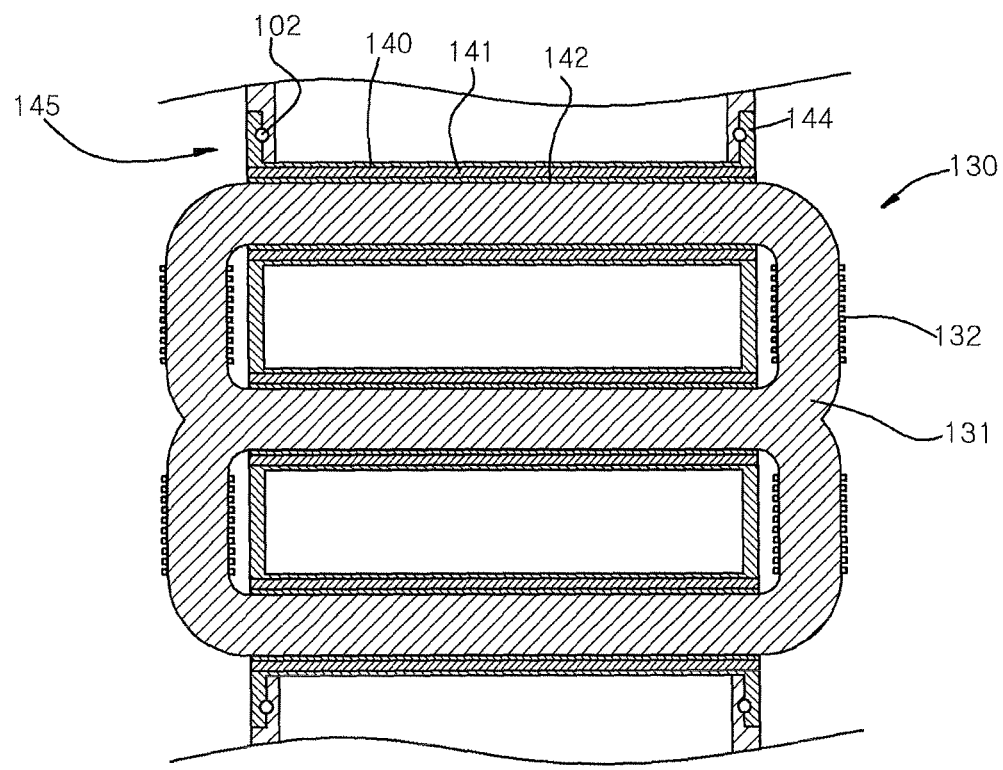
FIG. 21 is sectional view of the plasma reactor for illustrating a structure of mounting the core protecting tube.

FIG. 18 is a perspective view of a plasma reactor according to a modified embodiment, and FIG. 19 is a perspective view illustrating a structure of a reactor body of the plasma reactor of FIG. 18. FIG. 20 is a perspective view illustrating an integrated multiple core protecting tube of FIG. 18. FIG. 21 is sectional view of the plasma reactor for illustrating a structure of mounting the core protecting tube.

Referring to FIGS. 18 through 21, the plasma reactor 100 according to the modified embodiment may comprise the integrated multiple core protecting tube 145. In the integrated multiple core protecting tube 145, both ends of the core protecting tube 140 are formed in one body by a structure of each flange 144. The reactor body 110' includes an aperture 111' suitable shape for mounting the flange 144 of the multi core protecting tube 145. The reactor body 110' further includes a vacuum-insulating member 102 for vacuum-insulating a contact part of the flange 144 of the multiple core protecting tube 145 and the aperture 111'.

Figure 22:
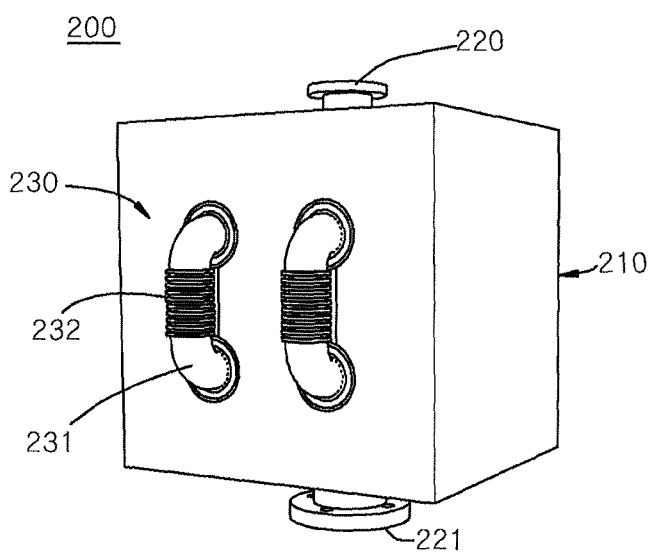
FIGS. 22, 23A and 23B are perspective views of plasma reactors according to other modified examples as alternative plans.
Figure 23A:
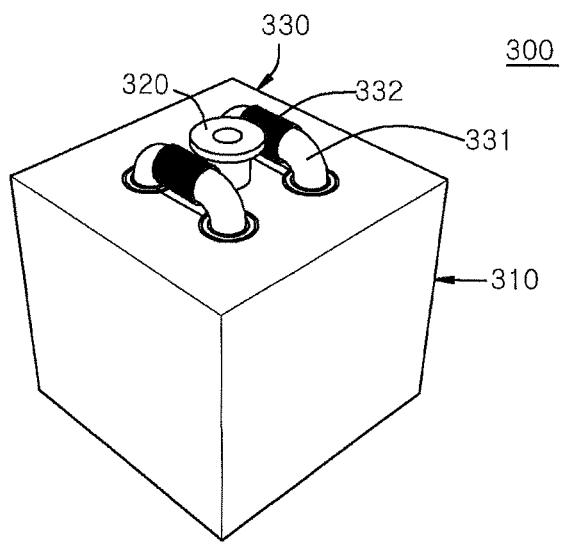
Figure 23B:
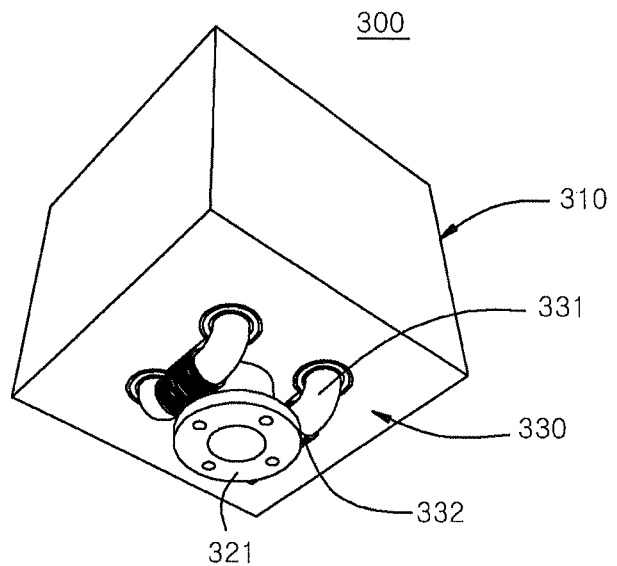

FIGS. 22, 23A and 23B are perspective views of plasma reactors according to other modified examples as alternative plans.

In FIG. 22, a plasma reactor 200 according to another modified example comprises a transformer 230 with a magnetic core 231 using a single loop and a primary winding 232. The magnetic core 231 is vertically mounted in a gas path formed between a gas entrance 220 and a gas exit 221.

In FIGS. 23A and 23B, a plasma reactor 300 according to another modified example comprises a transformer 330 with a magnetic core 331 and a primary winding 332. The magnetic core 331 is mounted in parallel to a gas flow path formed between a gas entrance 320 and a gas exit 321.

The above-described magnetic core mounted in the plasma reactor may be realized in many different modifications. However, these modifications within the scope of the present invention will be obvious to those skilled in the art.

Figure 24:
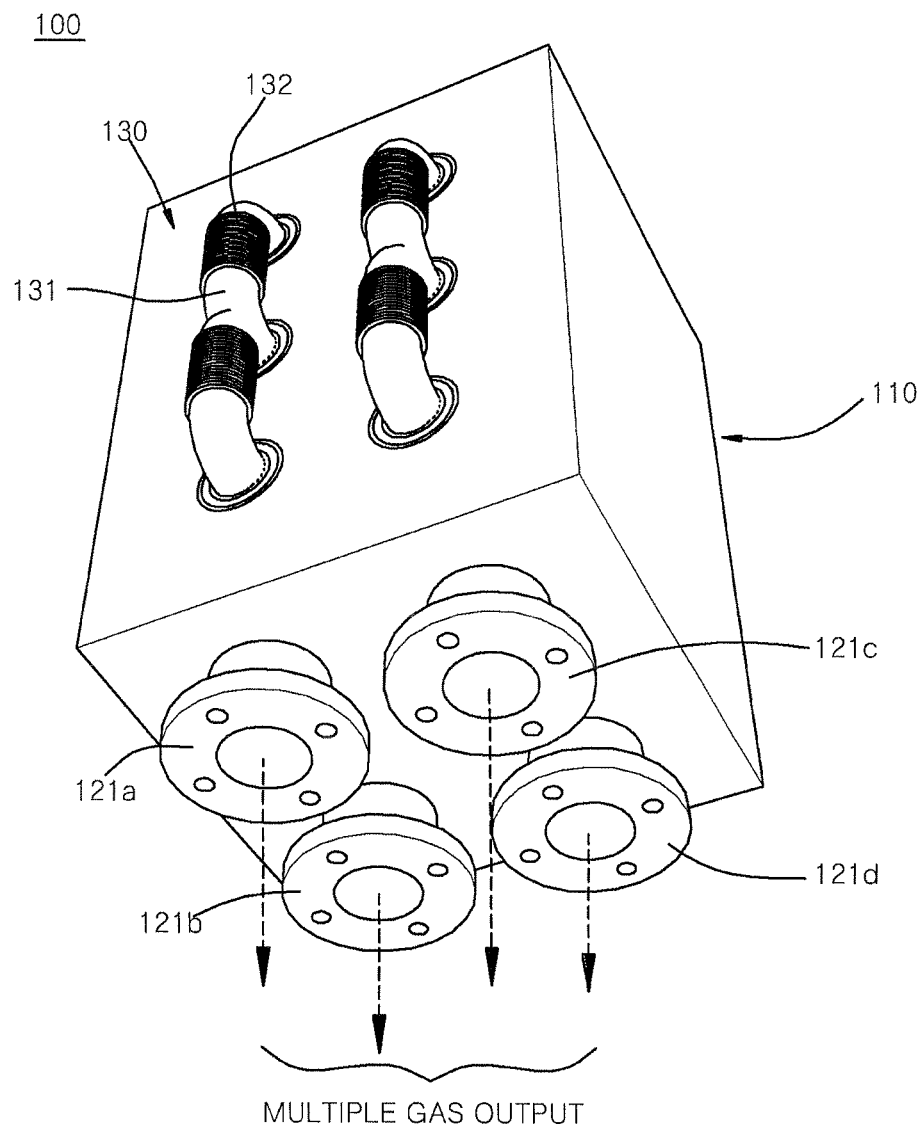
FIG. 24 is a bottom perspective view of a plasma reactor with multiple gas exits.

FIG. 24 is a bottom perspective view of a plasma reactor with multiple gas exits.

As illustrated in FIG. 24, the plasma reactor 100 may has two or more separated multiple gas exits 121*a*, 121*b*, 121*c* and 121*d*. The multiple gas exits 121*a* and 121*d* are effectively used for broadly and uniformly supplying plasma in a large area during a plasma process with large volume.

Figure 25:
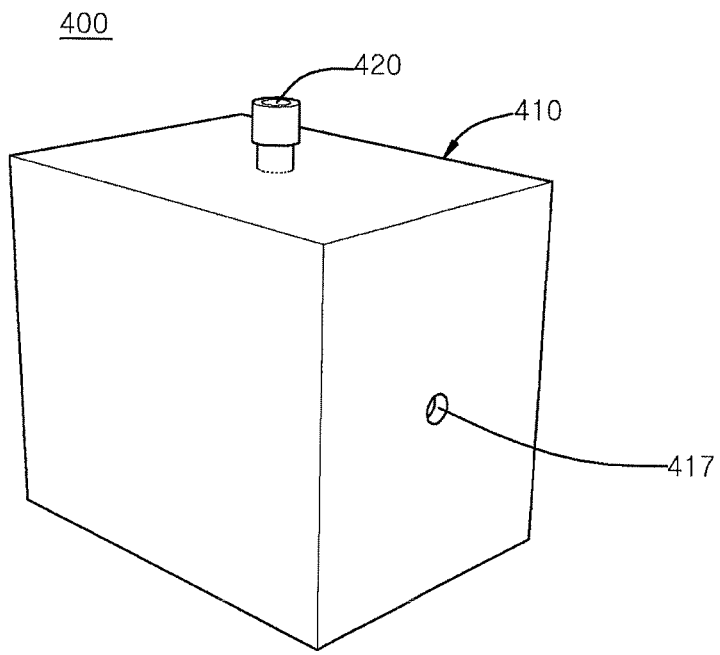
FIG. 25 is a perspective view of a plasma reactor according to another modified example, in which a magnetic core is mounted onto a sidewall of a reactor body.

FIG. 25 is a perspective view of a plasma reactor 400 according to another modified example, in which a magnetic core is mounted onto a sidewall of a reactor body. FIGS. 26A through 26D are views illustrating an internal structure of the plasma reactor of FIG. 25. The plasma reactor 400 has the same constitution as described above. Therefore, no further description of the same constitution will be presented.

Referring to FIGS. 25 and 26A through 26D, the plasma reactor 400 is characterized in that a reactor body 410 comprises a sidewall chamber 415 for receiving parts of a magnetic core 131. A magnetic core 131 of a transformer 430 has its part being mounted in the sidewall chamber 415 of the reactor body 410. The reactor body 410 has an aperture 417 externally opened to the sidewall chamber 415. The aperture 417 is used as a path for supplying a primary winding 432 and cooling water.

When the reactor body 410 is made of conductive metal, one or more insulating regions 412 to minimize the eddy current are properly formed in a sidewall 414 formed between the sidewall chamber 415 and a plasma reaction chamber 413. A core protecting tube 440 is independently mounted for each core cross sectional part. The sidewall 414 includes a number of apertures 411 for mounting the core protection tubes 440. Contact parts between two or more core protecting tubes 440 and a number of apertures 411 are vacuum-insulated by a vacuum-insulating member 402.

Figure 26A:
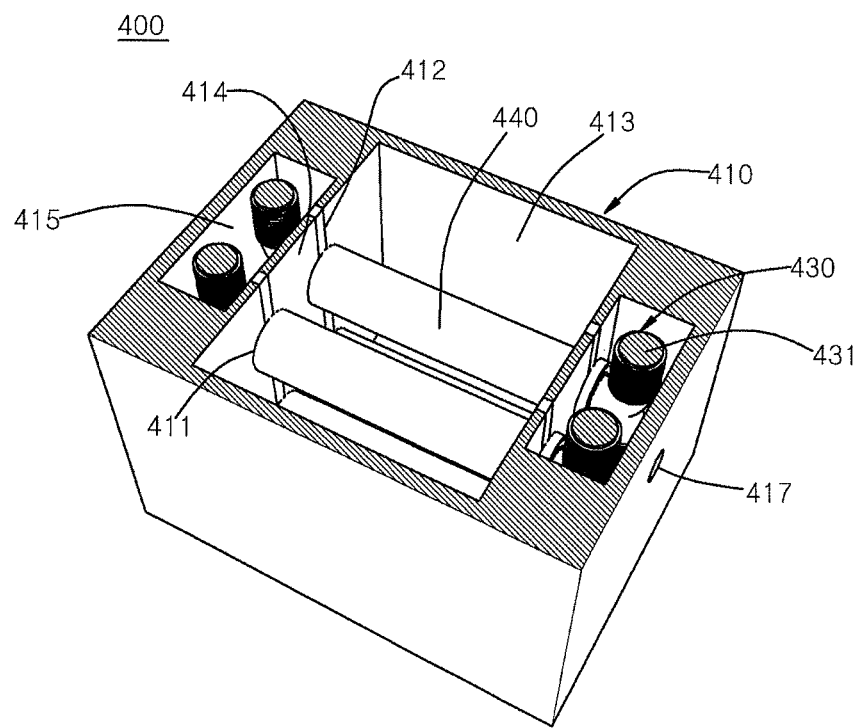
FIGS. 26A through 26D are views illustrating an internal structure of the plasma reactor of FIG. 25.
Figure 26B:
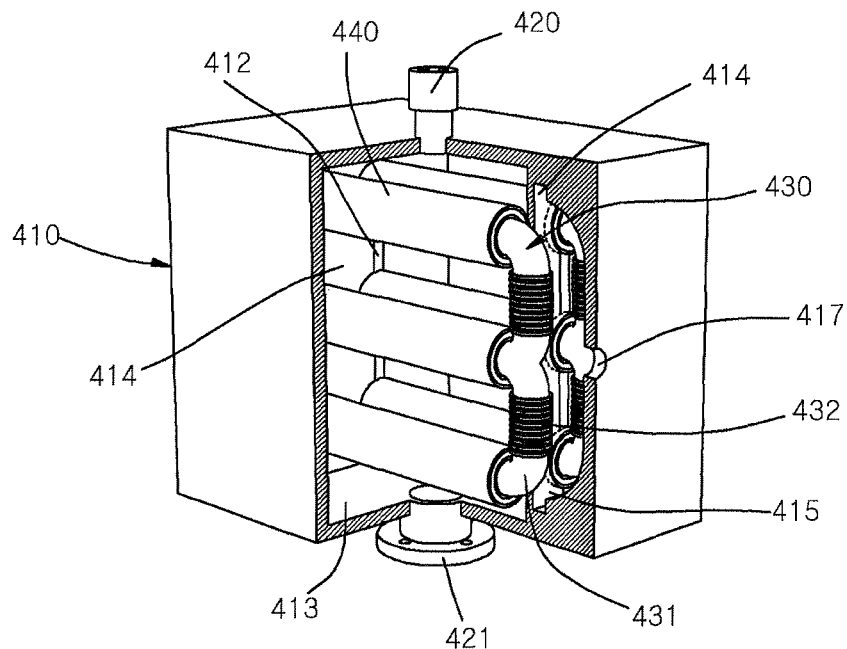
Figure 26C:
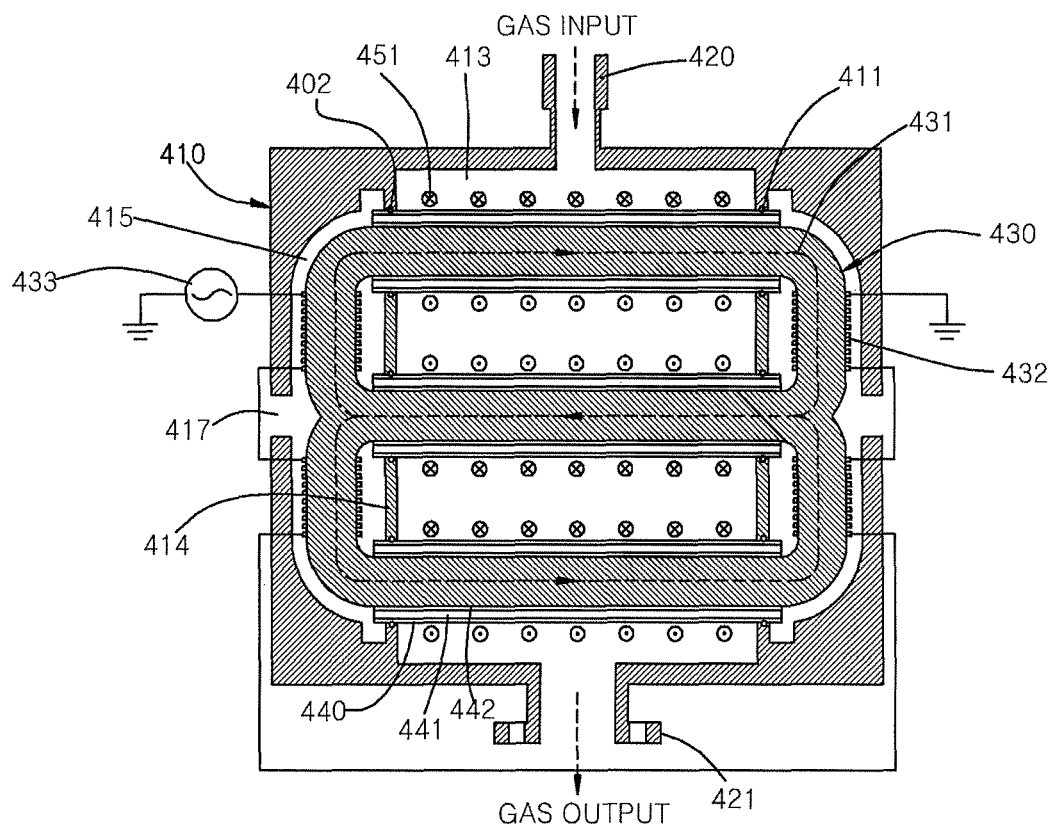
Figure 26D:
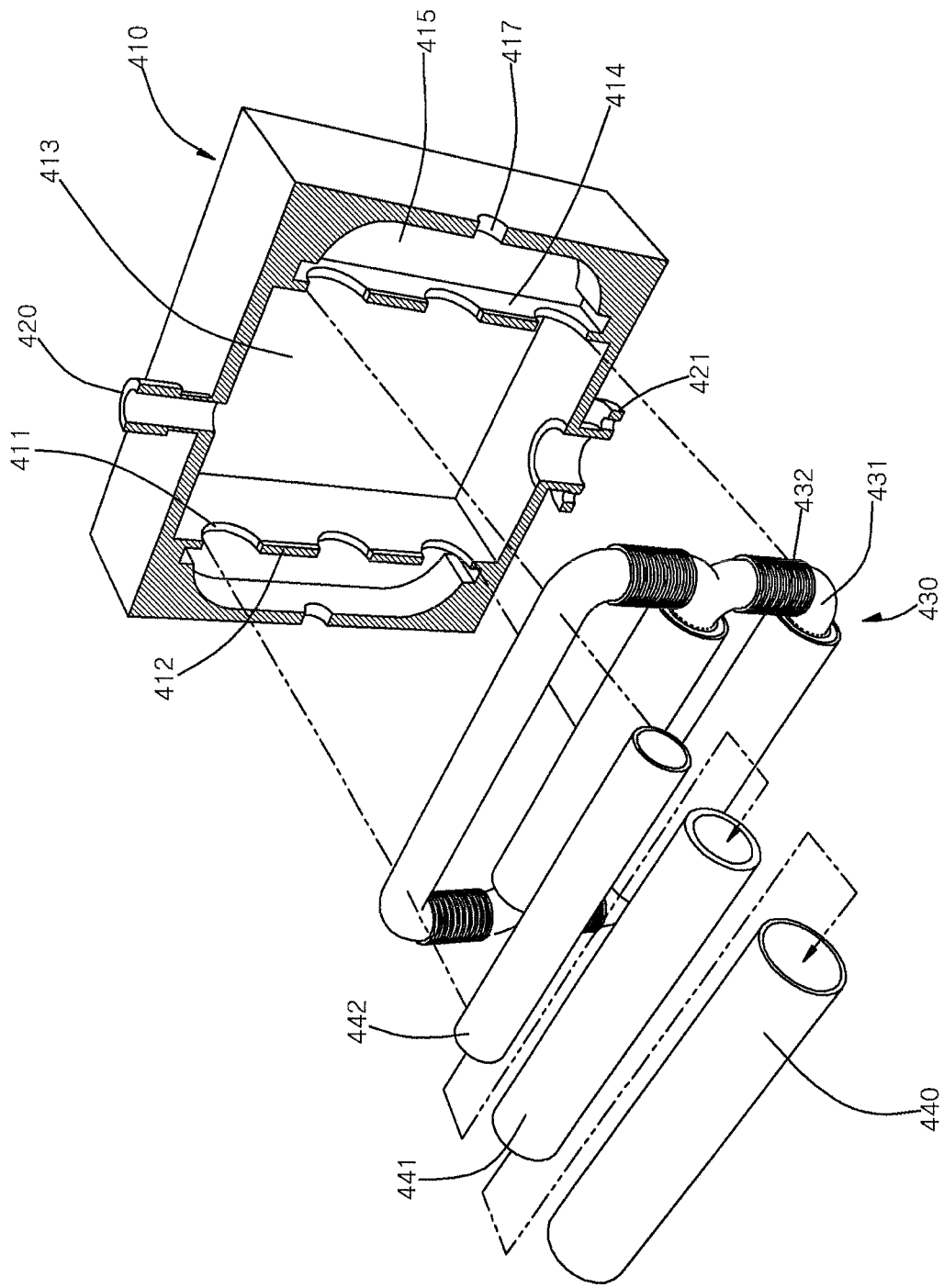

The core protecting tube 440, a cooling water supplying conduit 441 and a capacitively coupled electrode 442 are mounted in a magnetic core 431, as shown in FIG. 26D.

Figure 27:
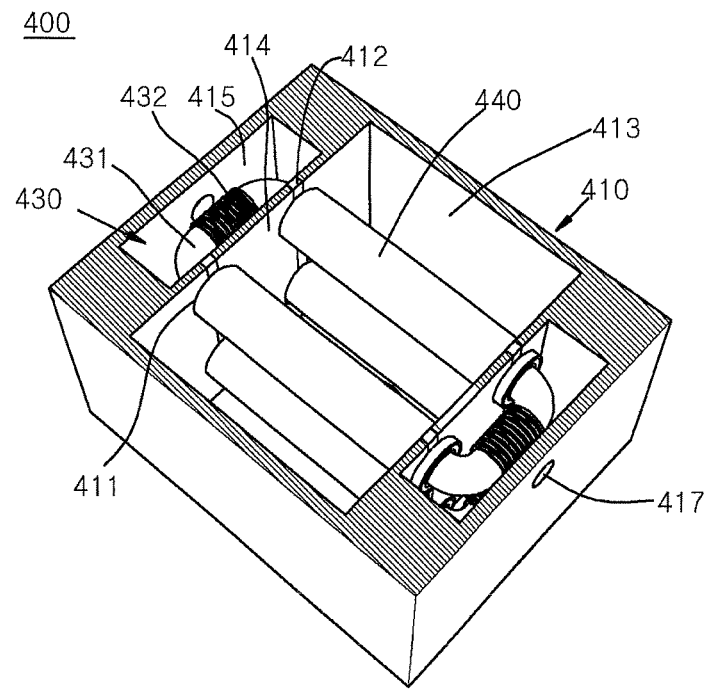
FIG. 27 is an exploded perspective view illustrating an example in which magnetic cores with a single loop is stacked to be mounted in parallel.

The magnetic core 431 with multiple routes is positioned in parallel, so that the core cross sectional part is vertically across between a gas entrance 420 and a gas exit 421. Alternatively, a number of magnetic cores 431 with a single loop are stacked in parallel as illustrated in FIG. 27.

Figure 28:
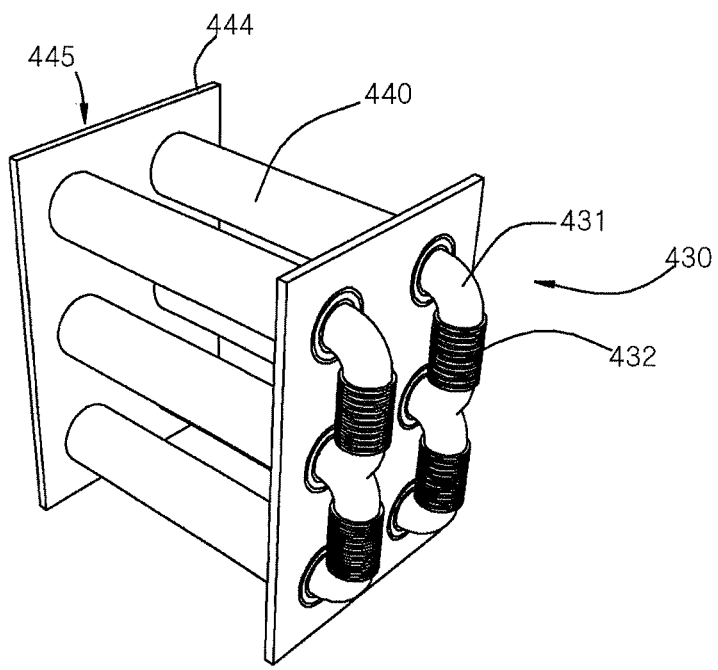
FIG. 28 is a perspective view of an integrated core protecting tube which is changed into a flange structure.

Alternatively, as illustrated in FIG. 28, the plasma reactor 400 may include an integrated multiple-core protecting tube 445 with a common flange 444. When the integrated multiple-core protecting tube 445 is constituted, a reactor body 410 is constituted as described above, with respect to appropriate modification and vacuum-insulation according to the multiple-core protecting tube 445.

Figure 29:
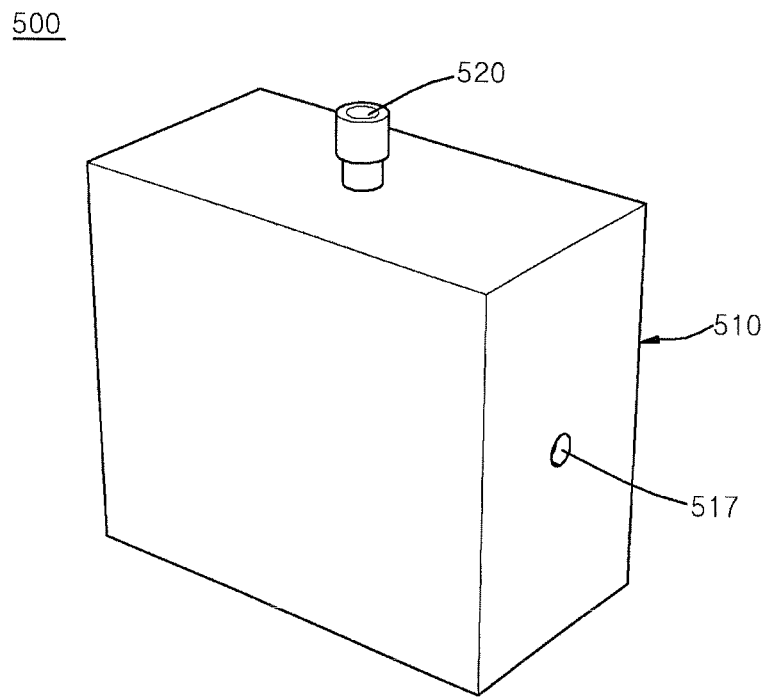
FIG. 29 is a perspective view of a plasma reactor according to another modified example.
Figure 30A:
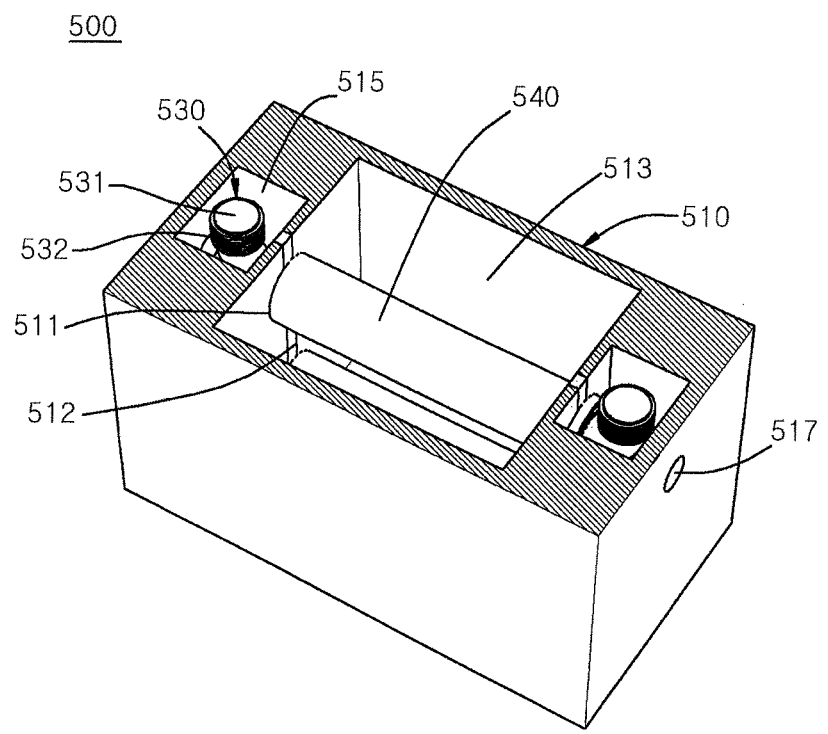
FIGS. 30A and 30B are sectional perspective views of the plasma reactor of FIG. 29.
Figure 30B:
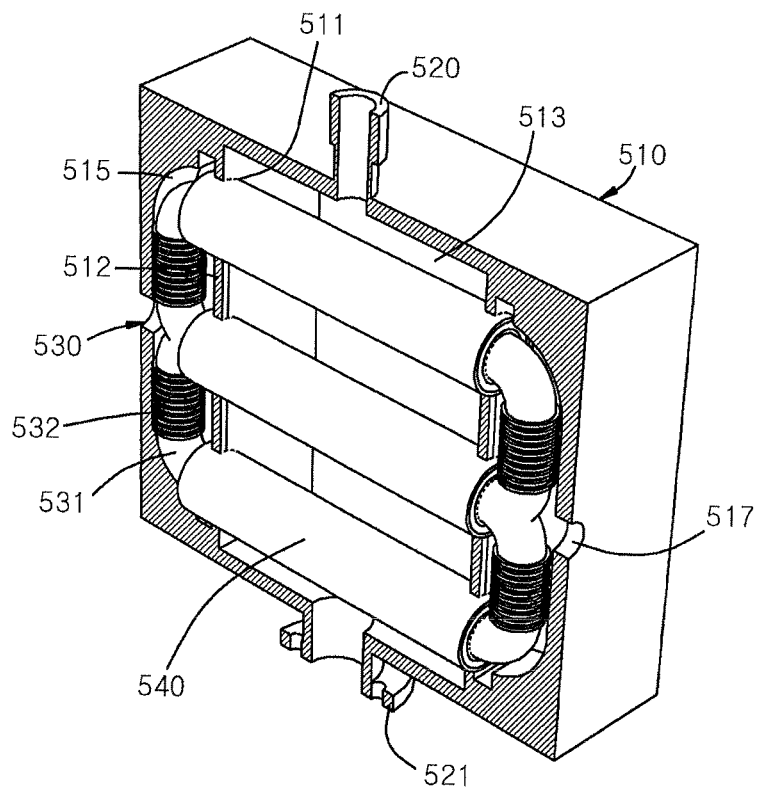

FIG. 29 is a perspective view of a plasma reactor according to another modified example, and FIGS. 30A and 30B are sectional perspective views of the plasma reactor of FIG. 29.

Figure 31:
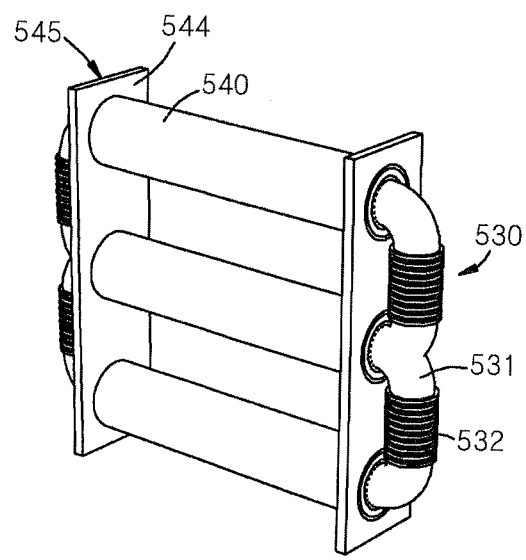
FIG. 31 is a perspective view of an integrated core protecting tube which is changed into a flange structure.

Referring to FIGS. 29, 30A and 30B, the plasma reactor 500 comprises a transformer 530 with a magnetic core 531 with multiple loops and a primary winding. This modification may be equally applicable to the above-described embodiments. Further, each independent core protecting tube 540 is used and a multiple-core protecting tube 545 with a common flange 544 may be used as illustrated in FIG. 31. Since the specific constitution and operation of the modified example of FIG. 29, except for these alternatively modifications, are same as those of the above-described modified examples, no detailed description thereof will be presented.

Figure 32:
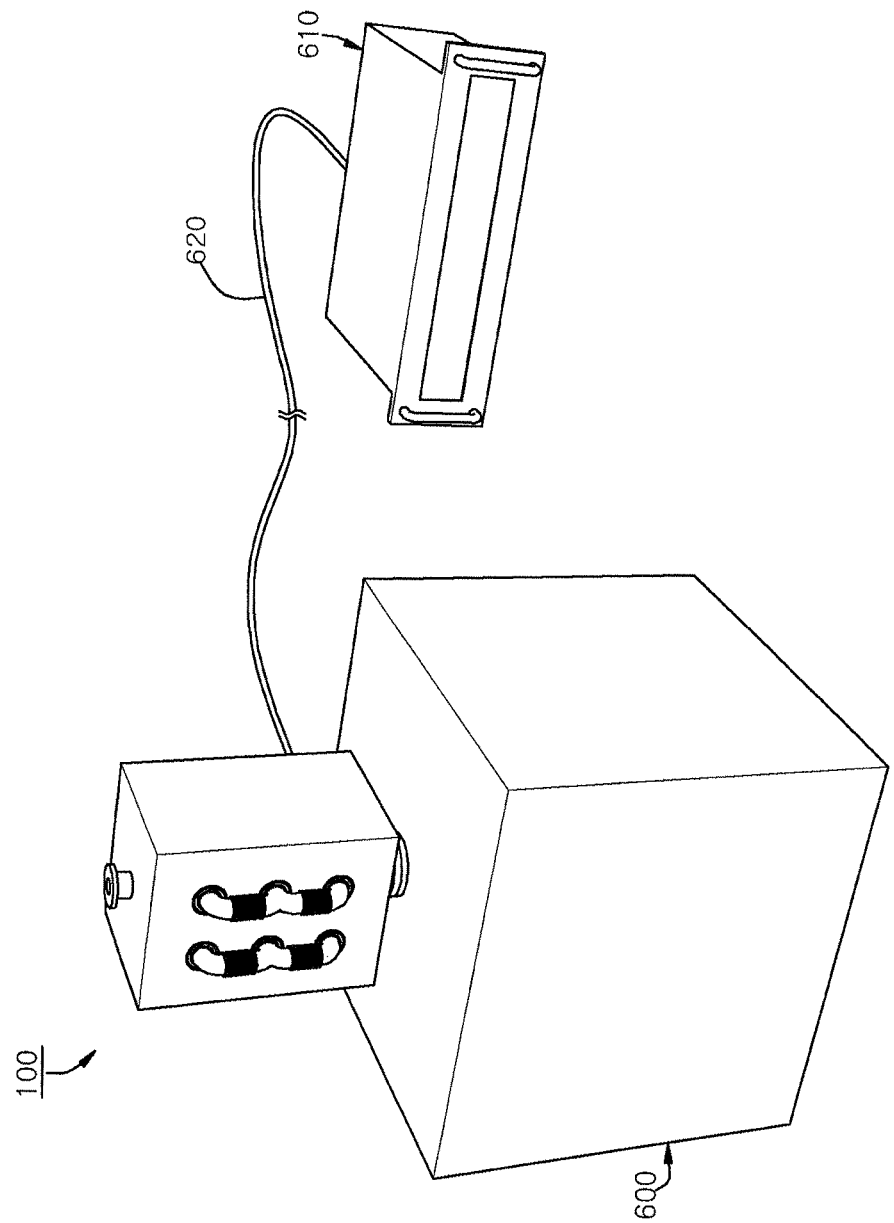
FIG. 32 is a view illustrating an example in which the plasma reactor is mounted in a process chamber.

FIG. 32 is a view illustrating an example in which the plasma reactor is mounted in a process chamber.

In FIG. 32, the plasma reactor 100 remotely supplies plasma to the process chamber 600. For example, the plasma reactor 100 may be positioned outside the ceiling of the process chamber 600. The plasma reactor 100 receives radio frequency from a radio frequency generator 610 which is a power supply source and receives a gas by a gas supplying system (not shown), thereby generating an active gas.

The process chamber 600 performs a predetermined plasma process by receiving the active gas generated in the plasma reactor 100. The process chamber 600 may be, for example, a deposition chamber for performing a deposition process or an etching chamber for performing an etching process. Or the process chamber 600 may be an ashing chamber for stripping photoresist. In addition, the process chamber 600 may be a plasma processing chamber for performing various semiconductor fabrication processes.

Specifically, the plasma reactor 100 and the radio frequency generator 610 are separated in structure. That is, the plasma reactor 100 is constituted to be fixedly mounted in the process chamber 600, and the radio frequency generator 610 is separable from the plasma reactor 100. An output terminal of the radio frequency generator 610 is remotely connected to a radio frequency input terminal of the plasma reactor 100 by a radio frequency cable 620. Therefore, unlike the conventional art in which the radio frequency generator and the plasma reactor are constituted in one unit, the plasma reactor 100 is very easily positioned in the process chamber 600 and the efficiency of maintenance of the system is enhanced.

Figure 33:
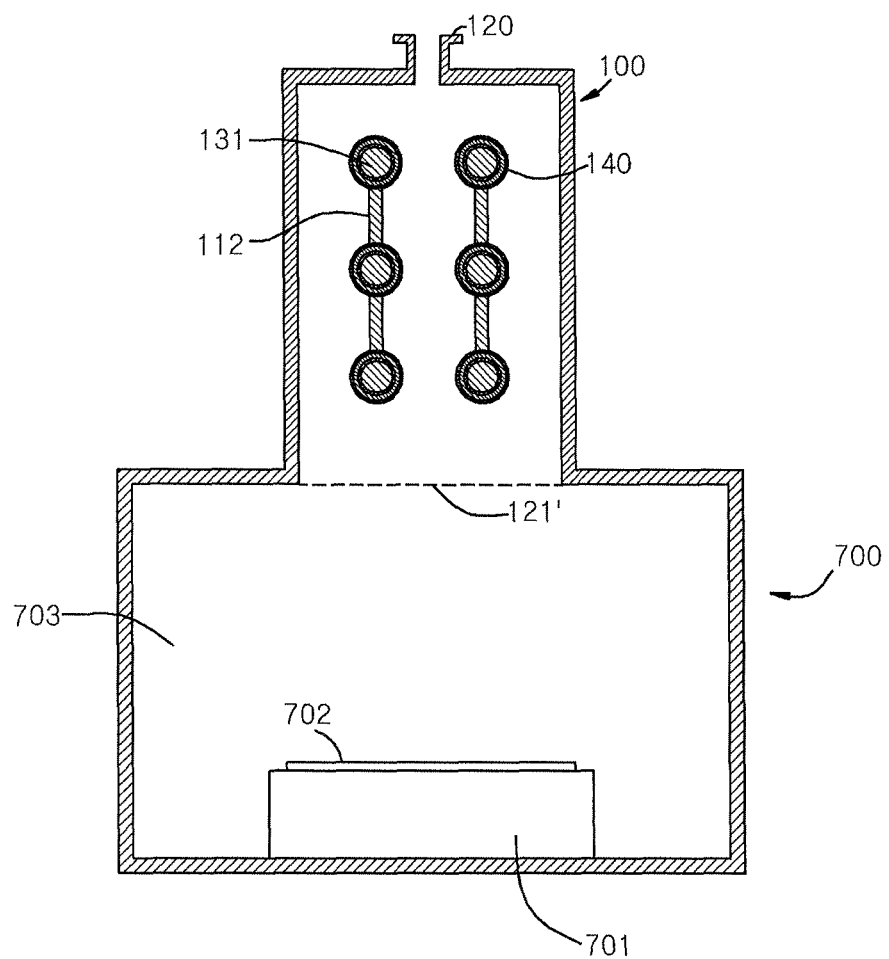
FIG. 33 is a view for explaining an inductively coupled plasma reactor formed in one body with a top of a process chamber.

FIG. 33 is a view for explaining an inductively coupled plasma reactor 100 formed in one body on a process chamber 700.

In FIG. 33, the plasma reactor 100 of the present invention may be combined with the process chamber 700 in one body. Preferably, the plasma reactor 100 is positioned on the ceiling opposite to a substrate supporting stage 701 positioned inside the process chamber 700. The bottom of the plasma reactor 100 has an entirely opened structure 121' towards the substrate supporting stage 701. An active gas generated in the plasma reactor 100 flows into an inner region 703 of the process chamber 700. Generally, the substrate supporting stage 701 is connected to a bias power source (not shown) so that active gas ions are accelerated towards a substrate 702.

In accordance with the plasma reactor with multiple discharge chambers of the present invention, since a number of magnetic core cross sectional parts are positioned inside the plasma discharge chamber, the efficiency of transferring the inductively coupled energy to be connected with plasma is very high. Furthermore, since a number of plasma discharge chambers are positioned in multistage arrangement, high density plasma is easily produced, without excessively increasing the radio frequency power. Furthermore, when the capacitively coupled electrode is included, since the variable capacitively coupled energy to be connected with plasma is additionally provided, the plasma is stably maintained and the plasma ion density and ion energy are easily controlled.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. An inductively coupled plasma reactor comprising:
a reactor body comprising a plurality of plasma discharge chambers;
a transformer comprising a magnetic core and a primary winding, the magnetic core being positioned inside at least two of the plurality of plasma discharge chambers and a part of the magnetic core is externally exposed out of the reactor body;
a core protecting tube to cover and protect parts of the magnetic core; and
a power supply source connected to the primary winding, wherein a current of the primary winding is driven by the power supply source, the driving current of the primary winding induces AC potential which generates inductively coupled plasma to complete a secondary circuit of the transformer, and the inductively coupled plasma is generated in the plasma discharge chamber to cover the outside of the core protecting tube.

2. The inductively coupled plasma reactor according to claim 1, wherein the reactor body comprises:
a gas entrance connected to at least one plasma discharge chamber,
a gas exit connected to at least another plasma discharge chamber, and
a connection path connecting the two plasma discharge chambers to each other.

3. The inductively coupled plasma reactor according to claim 2, wherein the reactor body comprises a gas collecting region connected to at least two chamber connection paths.

4. The inductively coupled plasma reactor according to claim 2, wherein the reactor body comprises a gas distributor for evenly distributing and supplying a gas to the gas entrance.

5. The inductively coupled plasma reactor according to claim 1, further comprising:
two or more separate multiple gas exits.

6. The inductively coupled plasma reactor according to claim 1, wherein the reactor body is made of a metal material and the metal material includes one or more electrically insulating regions to have electrical discontinuity in the metal material, to minimize an eddy current.

7. The inductively coupled plasma reactor according to claim 1, wherein the core protecting tube is made of a dielectric material.

8. The inductively coupled plasma reactor according to claim 1, wherein the core protecting tube includes a metal material and the metal material includes one or more electrically insulating regions to have electrical discontinuity in the metal material, to minimize the eddy current.

9. The inductively coupled plasma reactor according to claim 1, further comprising:
a cooling water supplying channel positioned inside the core protecting tube.

10. The inductively coupled plasma reactor according to claim 9, wherein the cooling water supplying channel includes a metal material and the metal material includes one or more electrically insulating regions to have electrical discontinuity in the metal material, to minimize the eddy current.

11. The inductively coupled plasma reactor according to claim 1, further comprising:
a cooling water supplying channel formed through the center of the magnetic core.

12. The inductively coupled plasma reactor according to claim 1, further comprising:
an impedance matcher performing impedance matching, the impedance matcher formed between the power supply source and the primary winding.

13. The inductively coupled plasma reactor according to claim 1, wherein the power supply source is operated without any adjustable matcher.

14. The inductively coupled plasma reactor according to claim 1, further comprising:
   a process chamber for receiving and storing a plasma gas generated in the reactor body.

15. The inductively coupled plasma reactor according to claim 14, wherein the reactor body has a structure to be mounted on the process chamber, the power supply source has a structure to be physically separated from the reactor body, and the power supply source and the reactor body are remotely connected by a power connection cable.

16. The inductively coupled plasma reactor according to claim 1, wherein a gas flowing into at least one plasma discharge chamber of the plurality of plasma discharge chambers is selected from a group including an inert gas, a reaction gas, and a mixture of these.

17. The inductively coupled plasma reactor according to claim 1, wherein the primary winding is wound about the part of the magnetic core that is externally exposed out of the reactor body, and the magnetic core travels from inside one of the at least two of the plurality of plasma discharge chambers to outside the reactor body to inside the other of the at least two of the plurality of plasma discharge chambers.

* * * * *